(12) United States Patent
Jeong et al.

(10) Patent No.: US 10,868,099 B2
(45) Date of Patent: Dec. 15, 2020

(54) DISPLAY DEVICE

(71) Applicant: SAMSUNG DISPLAY CO., LTD., Yongin-si (KR)

(72) Inventors: Jaehoon Jeong, Bucheon-si (KR); Hangyeol Kim, Hwaseong-si (KR); Sungguk An, Suwon-si (KR); Jiyun Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/440,568

(22) Filed: Jun. 13, 2019

(65) Prior Publication Data

US 2019/0312094 A1  Oct. 10, 2019

Related U.S. Application Data

(63) Continuation of application No. 15/841,156, filed on Dec. 13, 2017, now Pat. No. 10,347,707.

(30) Foreign Application Priority Data

Jun. 5, 2017 (KR) .......................... 10-2017-0069824

(51) Int. Cl.
*H01L 27/32* (2006.01)
*H01L 51/00* (2006.01)
(Continued)

(52) U.S. Cl.
CPC .... *H01L 27/3272* (2013.01); *G02F 1/133305* (2013.01); *G06F 1/1616* (2013.01);
(Continued)

(58) Field of Classification Search
CPC ............. H01L 27/3372; H01L 51/0097; H01L 27/3276; H01L 51/5284; H01L 51/5253;
(Continued)

(56) References Cited

U.S. PATENT DOCUMENTS

2012/0162565 A1  6/2012  Lee et al.
2016/0064694 A1  3/2016  Choi et al.
(Continued)

FOREIGN PATENT DOCUMENTS

KR  10-2013-0125260 A  11/2013
KR  10-2013-0142715 A  12/2013
(Continued)

*Primary Examiner* — Thinh T Nguyen
(74) *Attorney, Agent, or Firm* — Lewis Roca Rothgerber Christie LLP

(57) ABSTRACT

A display device includes a display panel, a light shielding member, a first cover member, a first light transmitting member, and a second cover member. The display panel includes a display region where a plurality of display structures are arranged and a peripheral region surrounding the display region. The light shielding member is in the peripheral region on the display panel, and has a first opening that exposes the display region. The first cover member is arranged on the light shielding member. The first light transmitting member is in the peripheral region on the first cover member, and includes a second opening that overlaps the first opening. The first light transmitting member has a first color. The second cover member is arranged on the first light transmitting member.

20 Claims, 18 Drawing Sheets

(51) Int. Cl.
 *G02F 1/1333* (2006.01)
 *G06F 1/16* (2006.01)
 *H01L 51/52* (2006.01)
 *G06F 3/041* (2006.01)
 *H01L 51/56* (2006.01)
 *B29D 11/00* (2006.01)

(52) U.S. Cl.
 CPC .......... *G06F 1/1652* (2013.01); *G06F 3/0412* (2013.01); *H01L 27/3276* (2013.01); *H01L 51/0097* (2013.01); *H01L 51/5253* (2013.01); *H01L 51/5284* (2013.01); *B29D 11/0073* (2013.01); *G02F 2001/133331* (2013.01); *G02F 2001/133388* (2013.01); *G02F 2202/28* (2013.01); *H01L 51/5246* (2013.01); *H01L 51/56* (2013.01); *H01L 2251/5338* (2013.01)

(58) Field of Classification Search
 CPC .. H01L 51/46; H01L 51/2237; H01L 51/5275
 USPC ............ 257/40, 72, 99; 438/48, 82, 99, 128
 See application file for complete search history.

(56) References Cited

U.S. PATENT DOCUMENTS

| | | |
|---|---|---|
| 2016/0146991 A1 | 5/2016 | Li et al. |
| 2016/0365402 A1* | 12/2016 | Lee et al. ............ H01L 27/3272 |
| 2017/0012235 A1 | 1/2017 | Kwon et al. |
| 2017/0221978 A1 | 8/2017 | Kajiyama |
| 2017/0308212 A1 | 10/2017 | Jin et al. |
| 2018/0122836 A1 | 5/2018 | Kang et al. |
| 2018/0166520 A1 | 6/2018 | Kang et al. |

FOREIGN PATENT DOCUMENTS

| | | |
|---|---|---|
| KR | 10-2014-0102946 A | 8/2014 |
| KR | 10-1437901 B1 | 9/2014 |
| KR | 10-1449621 B1 | 10/2014 |
| KR | 10-2016-0028558 A | 3/2016 |
| KR | 10-2016-0075411 A | 6/2016 |
| KR | 10-2017-0007670 A | 1/2017 |
| KR | 10-1700654 B1 | 1/2017 |

* cited by examiner

1100

DISPLAY DEVICE

CROSS-REFERENCE TO RELATED APPLICATIONS

This application is a continuation of U.S. patent application Ser. No. 15/841,156, filed on Dec. 13, 2017, which claims priority to and the benefit of Korean Patent Application No. 10-2017-0069824, filed on Jun. 5, 2017 in the Korean Intellectual Property Office (KIPO), the entire contents of each of which is incorporated herein by reference.

BACKGROUND

1. Field

Aspects of embodiments relate to display devices.

2. Description of the Related Art

A flat panel display (FPD) device is widely used as a display device of an electronic device because the FPD device is lightweight and thin compared to a cathode-ray tube (CRT) display device. Typical examples of the FPD device are a liquid crystal display (LCD) device and an organic light emitting display (OLED) device.

Recently, a flexible display device capable of bending or folding a portion of a display device by including lower and upper substrates, which have flexible materials, of a display panel included in the display device has been developed. For example, the lower substrate included in the display panel may be formed of a flexible substrate, and the upper substrate included in the display panel may have a thin film encapsulation structure. In addition, the flexible display device may further include a light transmitting member having a predetermined color, and the light transmitting member may be disposed in a peripheral region. Here, the peripheral region may surround a display region where a light of the display panel is emitted. Since the flexible display device includes the light transmitting member, various colors may be implemented in the peripheral region.

SUMMARY

According to an aspect of one or more example embodiments, a display device is provided. According to another aspect of one or more example embodiments, a flexible display device is provided.

According to one or more example embodiments, a display device includes a display panel, a light shielding member, a first cover member, a first light transmitting member, and a second cover member. The display panel includes a display region where a plurality of display structures are arranged and a peripheral region surrounding the display region. The light shielding member is in the peripheral region on the display panel, and includes a first opening that exposes the display region. The first cover member is arranged on the light shielding member. The first light transmitting member is in the peripheral region on the first cover member, and includes a second opening that overlaps the first opening. The first light transmitting member has a first color. The second cover member is arranged on the first light transmitting member.

In one or more example embodiments, the display device may further include a first adhesive member between the display panel and the light shielding member.

In one or more example embodiments, the first adhesive member may fill the first opening, and may be in direct contact with a lower surface of the first cover member. The first adhesive member may cover a lower surface of the light shielding member.

In one or more example embodiments, the display device may further include a second adhesive member between the first cover member and the first light transmitting member.

In one or more example embodiments, the second adhesive member may fill the second opening, and may be in direct contact with a lower surface of the second cover member. The second adhesive member may cover a lower surface of the second light transmitting member.

In one or more example embodiments, the display device may further include a second light transmitting member between the first cover member and the light shielding member, and the second light transmitting member may include a third opening. The third opening may overlap the first and second openings.

In one or more example embodiments, the first light transmitting member may be in direct contact with a lower surface of the second cover member, and the second light transmitting member may be in direct contact with a lower surface of the first cover member and an upper surface of the light shielding member.

In one or more example embodiments, the second light transmitting member may have the first color.

In one or more example embodiments, a thickness of the second light transmitting member may be less than a thickness of the first light transmitting member.

In one or more example embodiments, the display device may further include a first protection layer disposed between the first adhesive member and the light shielding member.

In one or more example embodiments, the first protection layer may fill the first and third openings, and may be in direct contact with a lower surface of the first cover member and an upper surface of the first adhesive member. The first protection layer may cover a lower surface of the shielding member.

In one or more example embodiments, a viscosity of the first protection layer may be less than a viscosity of the first adhesive member.

In one or more example embodiments, the first protection layer may be in direct contact with side walls defining the first and third openings.

In one or more example embodiments, the display device may further include a second protection layer between the second adhesive member and the first light transmitting member.

In one or more example embodiments, the second protection layer may fill the second opening, and may be in direct contact with a lower surface of the second cover member and an upper surface of the second adhesive member. The second protection layer may cover a lower surface of the first light transmitting member.

In one or more example embodiments, a viscosity of the second protection layer may be less than a viscosity of the second adhesive member.

In one or more example embodiments, the second protection layer may be in direct contact with side walls defining the second opening.

In one or more example embodiments, the display device may further include a polarizing layer and a touch screen electrode layer that are between the display panel and the first adhesive member. The display panel, the polarizing layer, and the touch screen electrode layer may be sequentially arranged.

In one or more example embodiments, each of the display structures included in the display panel may include a substrate, a semiconductor element on the substrate, a light emitting structure on the semiconductor element, and a thin film encapsulation structure on the light emitting structure.

In one or more example embodiments, the substrate and the thin film encapsulation structure may include flexible materials.

As the display device according to one or more example embodiments includes the first light transmitting member and the second light transmitting member, the display device may have the first color in the peripheral region, and a thickness of a first stepped portion may be relatively decreased. In addition, as the display device includes the first protection layer and the second protection layer that have a relatively low viscosity, the display device may prevent or substantially prevent a contact failure, and may be manufactured as a display device having an improved impact resistance.

BRIEF DESCRIPTION OF THE DRAWINGS

Some example embodiments can be understood in further detail from the following description taken in conjunction with the accompanying drawings, in which.

DETAILED DESCRIPTION

Herein, some example embodiments of the present inventive concept will be explained in further detail with reference to the accompanying drawings.

Figure 1:
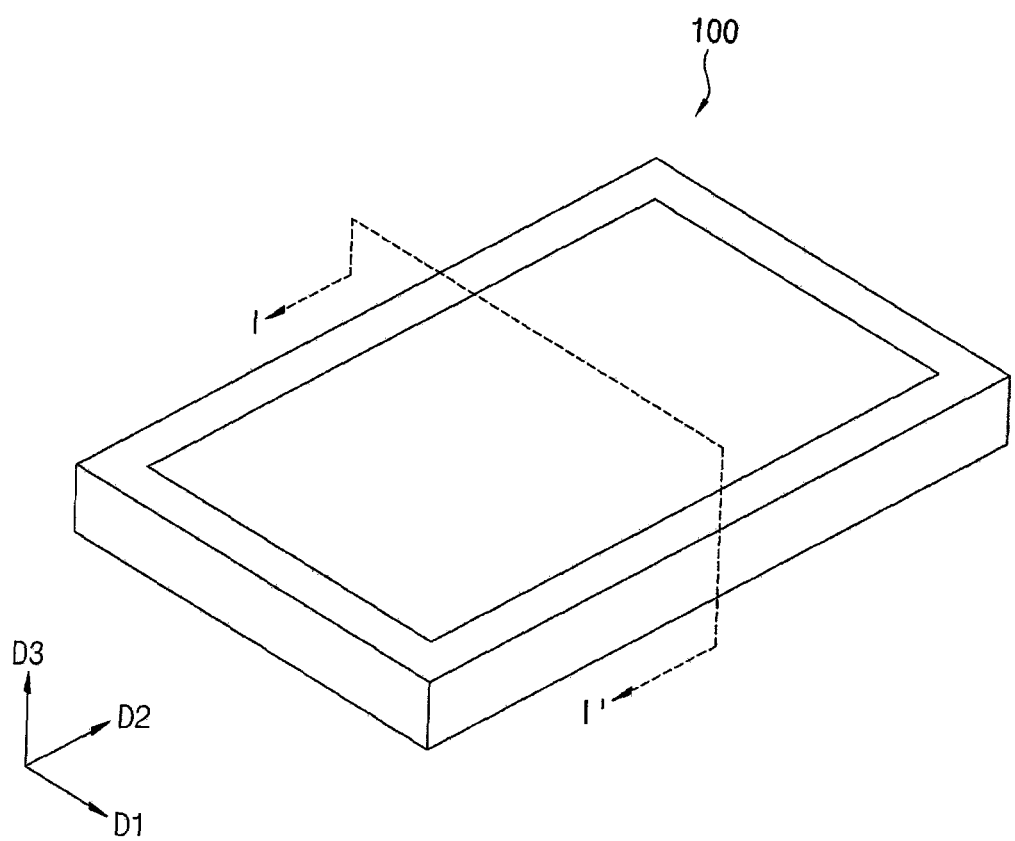
FIG. 1 is a perspective view illustrating a display device in accordance with example embodiments.
Figure 2:
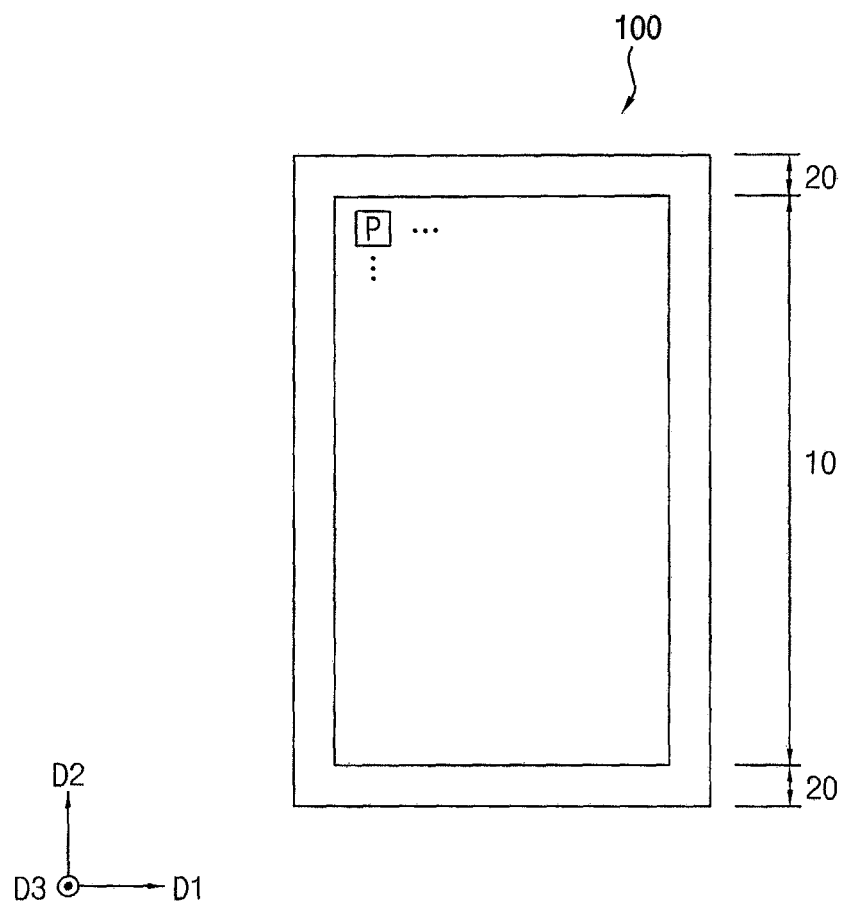
FIG. 2 is a plan view for describing display and peripheral regions included in the display device of FIG. 1.

FIG. 1 is a perspective view illustrating a display device in accordance with example embodiments; and FIG. 2 is a plan view for describing display and peripheral regions included in the display device of FIG. 1.

Referring to FIGS. 1 and 2, a display device 100 may include a display region 10 and a peripheral region 20 that surrounds the display region 10. A plurality of display structures P may be disposed in the display region 10 (e.g., an active region), and the display structures may emit a light. Wirings (e.g., scan signal wirings, data signal wirings, power supply voltage wirings, etc.) may be disposed in the peripheral region 20. Here, the wirings may be electrically connected to the display structures P. In addition, a scan driving unit generating the scan signals and a data driving unit generating the data signals may be disposed in the peripheral region 20.

In example embodiments, the light shielding member may be disposed in the peripheral region 20 so as to prevent or substantially prevent a light incident from the outside (e.g., an external light) from being reflected from the wirings. In addition, a light transmitting member having a color (e.g., a predetermined color) may be disposed on the light shielding member disposed in the peripheral region 20 such that various colors are implemented in the peripheral region 20.

In example embodiments, shapes of the display region 10 and the peripheral region 20 may have a planar shape of a tetragon, but are not limited thereto. For example, in some example embodiments, shapes of the display region 10 and the peripheral region 20 may have a planar shape of a substantially triangular shape, a substantially diamond shape, a substantially polygonal shape, a substantially circular shape, a substantially oval or athletic track shape, or a substantially elliptical shape.

Figure 3:
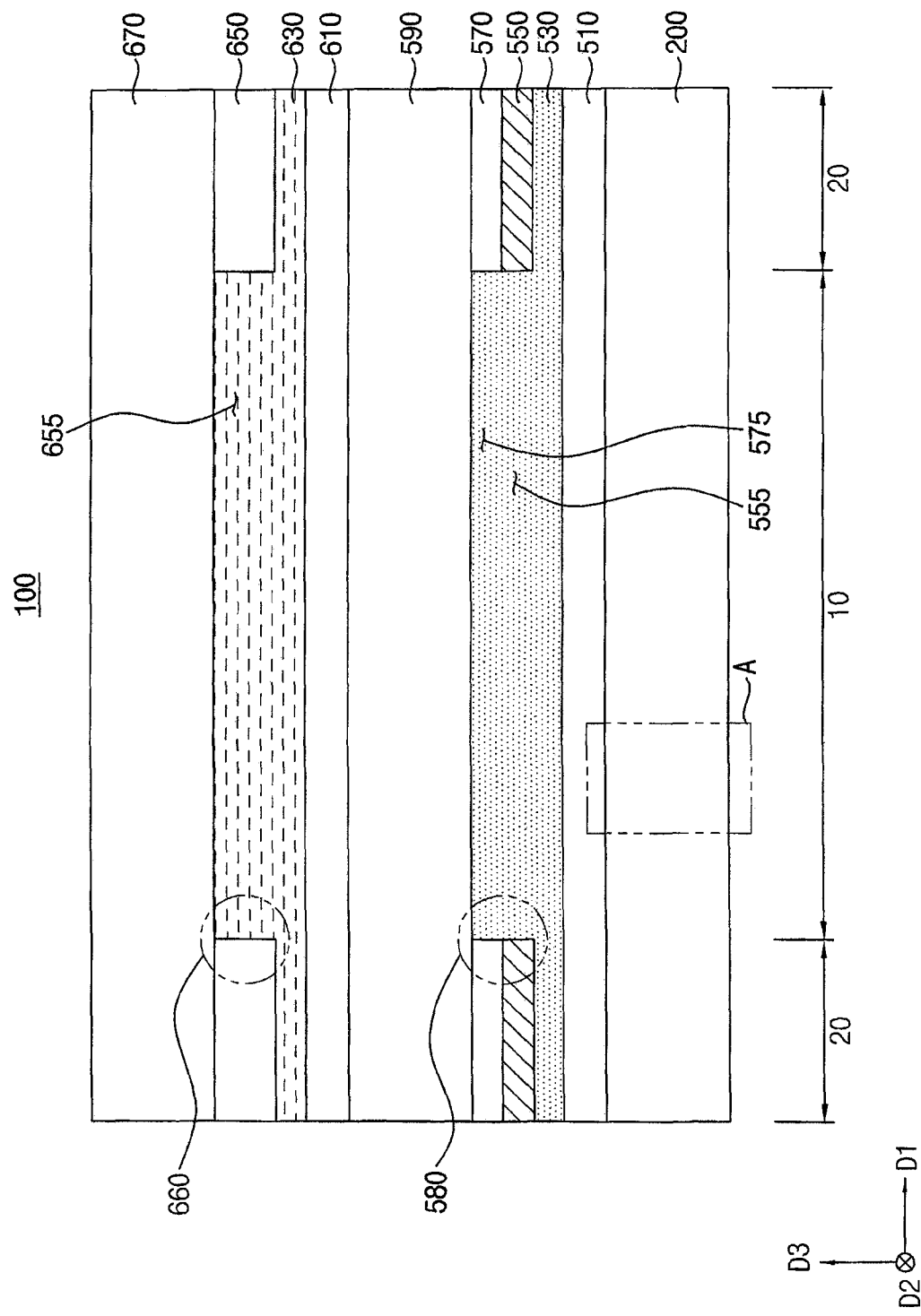
FIG. 3 is a cross-sectional view taken along the line I-I' of FIG. 1.
Figure 4:
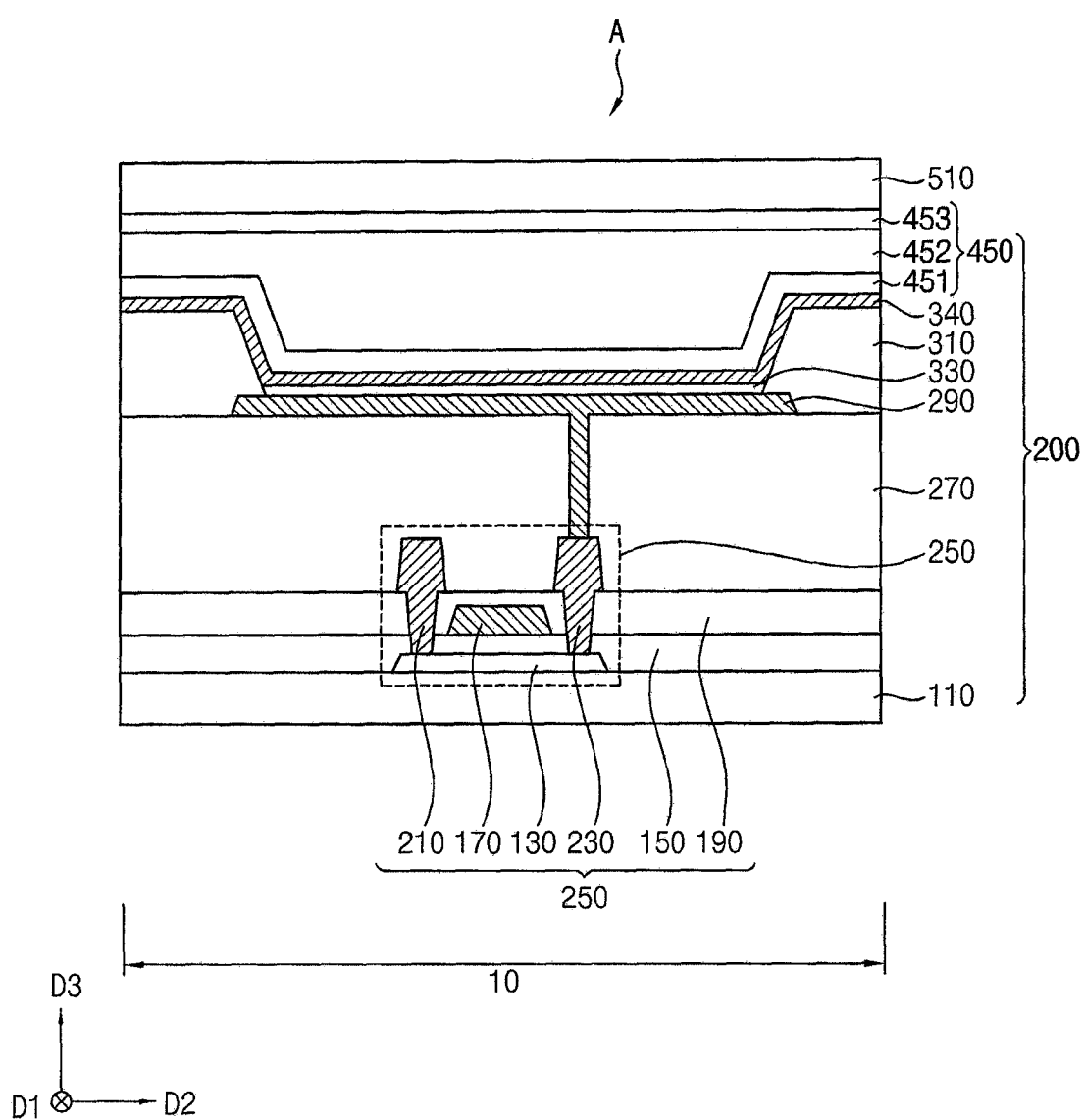
FIG. 4 is an enlarged partial cross-sectional view corresponding to the region "A" of FIG. 3.

FIG. 3 is a cross-sectional view taken along the line I-I' of FIG. 1; and FIG. 4 is an enlarged partial cross-sectional view corresponding to the region "A" of FIG. 3.

Referring to FIGS. 3 and 4, the display device 100 may include a display panel 200, a first adhesive member 510, a first protection layer 530, a light shielding member 550, a second light transmitting member 570, a first cover member 590, a second adhesive member 610, a second protection layer 630, a first light transmitting member 650, a second cover member 670, etc. The display device 100 may display an image in the display region 10, and may have a color (e.g., a predetermined color) in the peripheral region 20. In addition, the display panel 200 may be manufactured as a flexible display panel. Accordingly, the display device 100 may serve as a flexible display device having the color (e.g., the predetermined color) in the peripheral region 20.

The display panel 200 may include a plurality of display structures, and each of the display structures may include a substrate 110, a semiconductor element 250, a planarization layer 270, a pixel defining layer 310, a lower electrode 290, a light emitting layer 330, an upper electrode 340, and a thin film encapsulation (TFE) structure 450. In addition, the semiconductor element 250 may include an active layer 130, a gate insulation layer 150, a gate electrode 170, an insulating interlayer 190, a source electrode 210, and a drain electrode 230, and the TFE structure 450 may include a first TFE layer 451, a second TFE layer 452, and a third TFE layer 453.

The substrate 110 may include transparent materials or opaque materials. The substrate 110 may be formed of a flexible transparent material, such as a flexible transparent resin substrate (e.g., a polyimide substrate). For example, the polyimide substrate may include a first polyimide layer, a first barrier film layer, a second polyimide layer, a second barrier film layer, etc. The polyimide substrate may be relatively thin and flexible, and the polyimide substrate may be disposed on a rigid glass substrate to help support the formation of the semiconductor element 250 and the light emitting structure (e.g., the lower electrode 290, the light emitting layer 330, the upper electrode 340, etc.). That is, the substrate 110 may have a structure in which the first polyimide layer, the first barrier film layer, the second polyimide layer, and the second barrier film layer are stacked on the rigid glass substrate. In manufacturing the display device 100, after an insulating layer (e.g., a buffer layer) is provided on the second barrier layer of the polyimide substrate, the semiconductor element 250 and the light emitting structure may be disposed on the insulating layer. After the semiconductor element 250 and the light emitting structure are formed on the insulating layer, the rigid glass substrate on which the polyimide substrate is disposed may be removed. It may be difficult to directly form the semiconductor element 250 and the light emitting structure on the polyimide substrate because the polyimide substrate is relatively thin and flexible. Accordingly, the semiconductor element 250 and the light emitting structure may be formed on the polyimide substrate and the rigid glass substrate, and then the polyimide substrate may serve as the substrate 110 of the display device 100 after the removal of the rigid glass substrate. Alternatively, the substrate 110 may include a quartz substrate, a synthetic quartz substrate, a calcium fluoride substrate, a fluoride-doped quartz substrate, a soda-lime glass substrate, a non-alkali glass substrate, etc.

A buffer layer (not shown) may be disposed on the substrate 110. The buffer layer may be disposed on the entire substrate 110. The buffer layer may prevent or substantially prevent the diffusion of metal atoms and/or impurities from the substrate 110 into the semiconductor element 250 or the light emitting structure. In addition, the buffer layer may control a rate of heat transfer in a crystallization process for forming the active layer 130, thereby obtaining substantially uniform the active layer 130. Further, the buffer layer may improve a surface flatness of the substrate 110 when a surface of the substrate 110 is relatively irregular. According to a type of the substrate 110, at least two buffer layers may be provided on the substrate 110, or the buffer layer may not be disposed. For example, the buffer layer may include a silicon compound, a metal oxide, etc.

The active layer 130 may be disposed on the substrate 110. The active layer 130 may include an oxide semiconductor, an inorganic semiconductor (e.g., amorphous silicon, polysilicon, etc.), an organic semiconductor, etc.

The gate insulation layer 150 may be disposed on the active layer 130. The gate insulation layer 150 may cover the active layer 130, and may be disposed on the substrate 110. For example, the gate insulation layer 150 may sufficiently cover the active layer 130 on the substrate 110, and may have a substantially level surface without a step around the active layer 130. Alternatively, the gate insulation layer 150 may cover the active layer 130 on the substrate 110, and may be disposed to have a substantially uniform thickness along a profile of the active layer 130. The gate insulation layer 150 may include a silicon compound, a metal oxide, etc. For example, the gate insulation layer 150 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc.

The gate electrode 170 may be disposed on a portion of the gate insulation layer 150 under which the active layer 130 is located. The gate electrode 170 may include a metal, a metal alloy, a metal nitride, a conductive metal oxide, transparent conductive materials, etc. For example, the gate electrode 170 may include gold (Au), silver (Ag), aluminum (Al), platinum (Pt), nickel (Ni), titanium (Ti), palladium (Pd), magnesium (Mg), Calcium (Ca), lithium (Li), chromium (Cr), tantalum (Ta), tungsten (W), copper (Cu), molybdenum (Mo), scandium (Sc), neodymium (Nd), iridium (Ir), an alloy of aluminum, aluminum nitride (AlNx), an alloy of silver, tungsten nitride (WNx), an alloy of copper, an alloy of molybdenum, titanium nitride (TiNx), chromium nitride (CrNx), tantalum nitride (TaNx), strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. These may be used alone or in a suitable combination thereof. In some example embodiments, the gate electrode 170 may have a multi-layered structure.

The insulating interlayer 190 may be disposed on the gate electrode 170. The insulating interlayer 190 may cover the gate electrode 170, and may be disposed on the gate insulation layer 150. For example, the insulating interlayer 190 may sufficiently cover the gate electrode 170 on the gate insulation layer 150, and may have a substantially level surface without a step around the gate electrode 170. Alternatively, the insulating interlayer 190 may cover the gate electrode 170 on the gate insulation layer 150, and may be disposed to have a substantially uniform thickness along a profile of the gate electrode 170. The insulating interlayer 190 may include a silicon compound, a metal oxide, etc.

The source electrode 210 and the drain electrode 230 may be disposed on the insulating interlayer 190. The source electrode 210 may be in direct contact with a first side (e.g., a source region) of the active layer 130 via a contact hole formed by removing a portion of the gate insulation layer 150 and the insulating interlayer 190. The drain electrode 230 may be in direct contact with a second side (e.g., a drain region) of the active layer 130 via a contact hole formed by removing another portion of the gate insulation layer 150 and the insulating interlayer 190. The source electrode 210 and the drain electrode 230 may include a metal, an alloy, a metal nitride, a conductive metal oxide, transparent conductive materials, etc. These may be used alone or in a suitable combination thereof. In some example embodiments, each of the source and drain electrodes 210 and 230 may have a multi-layered structure. Accordingly, the semiconductor element 250 including the active layer 130, the gate insulation layer 150, the gate electrode 170, the insulating interlayer 190, the source electrode 210, and the drain electrode 230 may be disposed.

In example embodiments, the semiconductor element 250 has a top gate structure, but is not limited thereto. For example, in some example embodiments, the semiconductor element 250 may have a bottom gate structure.

The planarization layer 270 may be disposed on the source electrode 210 and the drain electrode 230. The planarization layer 270 may cover the source electrode 210 and the drain electrode 230, and may be disposed on the entire insulating interlayer 190. In example embodiments, the planarization layer 270 may be disposed to have a high thickness to sufficiently cover the source and drain electrodes 210 and 230. In this case, the planarization layer 270 may have a substantially flat upper surface, and a planarization process may be further performed on the planarization layer 270 to implement the flat upper surface of the planarization layer 270. Alternatively, the planarization layer 270 may cover the source and drain electrodes 210 and 230, and may be disposed to have a substantially uniform thickness along a profile of the source and drain electrodes 210 and 230. The planarization layer 270 may include organic materials or inorganic materials. In example embodiments, the planarization layer 270 may include organic materials. For example, the planarization layer 270 may include polyimide, epoxy-based resin, acryl-based resin, polyester, photoresist, polyacryl-based resin, polyimide-based resin, polyamide-based resin, siloxane-based resin, etc.

The lower electrode 290 may be disposed on the planarization layer 270. The lower electrode 290 may be in contact with the drain electrode 230 via a contact hole formed by removing a portion of the planarization layer 270. In addition, the lower electrode 290 may be electrically connected to the semiconductor element 250. The lower electrode 290 may include a metal, a metal alloy, a metal nitride, a conductive metal oxide, transparent conductive materials, etc. These may be used alone or in a suitable combination thereof. In some example embodiments, the lower electrode 290 may have a multi-layered structure.

The pixel defining layer 310 may be disposed on the planarization layer 270 and may expose a portion of the lower electrode 290. In this case, the light emitting layer 330 may be disposed on the portion of the lower electrode 290 exposed by the pixel defining layer 310. The pixel defining layer 310 may include organic materials or inorganic materials. In example embodiments, the pixel defining layer 310 may include organic materials.

The light emitting layer 330 may be disposed in a portion where the portion of the lower electrode 290 is exposed. The light emitting layer 330 may be formed using at least one of light emitting materials capable of generating different colors of light (e.g., a red color of light, a blue color of light, and a green color of light, etc.) according to sub-pixels. Alternatively, the light emitting layer 330 may generally generate a white color of light by stacking a plurality of light emitting materials capable of generating different colors of light such as a red color of light, a green color of light, a blue color of light, etc. In this case, a color filter may be disposed on the light emitting layer 330. The color filter may include at least one selected from a red color filter, a green color filter, and a blue color filter. Alternatively, the color filter may include a yellow color filter, a cyan color filter, and a magenta color filter. The color filter may include a photosensitive resin (or color photoresist), etc.

The upper electrode 340 may be disposed on the pixel defining layer 310 and the light emitting layer 330. The upper electrode 340 may include a metal, a metal alloy, a metal nitride, a conductive metal oxide, transparent conductive materials, etc. These may be used alone or in a suitable combination thereof. In some example embodiments, the upper electrode 340 may have a multi-layered structure. Accordingly, the light emitting structure including the lower electrode 290, the light emitting layer 330, and the upper electrode 340 may be disposed.

The first TFE layer 451 may be disposed on the upper electrode 340. The first TFE layer 451 may cover the upper electrode 340, and may be disposed to have a substantially uniform thickness along a profile of the upper electrode 340. The first TFE layer 451 may prevent or substantially prevent the light emitting structure from being deteriorated by the permeation of moisture, water, oxygen, etc. In addition, the first TFE layer 451 may protect the light emitting structure from external impacts. The first TFE layer 451 may include inorganic materials.

The second TFE layer 452 may be disposed on the first TFE layer 451. The second TFE layer 452 may improve the flatness of the display panel 200, and may protect the light emitting structure. The second TFE layer 452 may include organic materials.

The third TFE layer 453 may be disposed on the second TFE layer 452. The third TFE layer 453 may cover the second TFE layer 452, and may be disposed to have a substantially uniform thickness along a profile of the second TFE layer 452. The third TFE layer 453, together with the first TFE layer 451 and the second TFE layer 452, may prevent or substantially prevent the light emitting structure from being deteriorated by the permeation of moisture, water, oxygen, etc. In addition, the third TFE layer 453, together with the first TFE layer 451 and the second TFE layer 452, may protect the light emitting structure from external impacts. The third TFE layer 453 may include inorganic materials. Alternatively, the TFE structure 450 may have a five-layer structure in which first to fifth TFE layers are stacked, or a seven-layer structure in which first to seventh TFE layers are stacked.

Accordingly, the TFE structure 450 including the first TFE layer 451, the second TFE layer 452, and the third TFE layer 453 may be disposed. In addition, the display panel 200 including the substrate 110, the semiconductor element 250, the planarization layer 270, the lower electrode 290, the pixel defining layer 310, the light emitting layer 330, the upper electrode 340, and the TFE structure 450 may be disposed.

In some example embodiments, a bottom protection film may be disposed on a lower surface of the display panel 200. The bottom protection film may protect a lower surface of the display panel 200.

The first cover member 590 may be disposed on the display panel 200. For example, the first cover member 590 may be entirely disposed in the display region 10 and the peripheral region 20 on the display panel 200, and may protect the display panel 200. In example embodiments, the first cover member 590 may have a multi-layered structure. For example, the first cover member 590 may include protection coating layers and base film layers, etc. that include organic materials or inorganic materials. The protection coating layer may be disposed on the base film layer, and a viscosity of the protection coating layer may be greater than a viscosity of the base film layer such that the protection coating layer protects the base film layer. The base film layer may include polyimide, polyethylene terephthalate (PET), polyethylene naphthalene (PEN), polypropylene (PP), polycarbonate (PC), polystyrene (PS), polysulfone (PSul), polyethylene (PE), polyphthalamide (PPA), polyethersulfone (PES), polyarylate (PAR), polycarbonate oxide (PCO), modified polyphenylene oxide (MPPO), urethane, thermoplastic polyurethane (TPU), etc. In addition, the protection coating layer may include acryl-based materials, epoxy-based materials, etc.

The second cover member 670 may be disposed on the first cover member 590. For example, the second cover member 670 may be entirely disposed in the display region 10 and the peripheral region 20 on the display panel 200, and may protect the first cover member 590 and the display panel 200. In example embodiments, the second cover member 670 may have a multi-layered structure. The second cover member 670 may include protection coating layers and base film layers, etc. that include organic materials or inorganic materials.

The light shielding member 550 may be disposed in the peripheral region 20 on a lower surface of the first cover member 590. The light shielding member 550 may have a first opening 555. The first opening 555 may expose the display region 10, and an image of the display panel 200 may be displayed via the first opening 555. In other words, since the light shielding member 550 is disposed along the peripheral region 20, a shape of the light shielding member 550 may have a planar shape of a substantially athletic track. As the light shielding member 550 is disposed in the peripheral region 20, a plurality of wirings that are disposed in the peripheral region 20 of the display panel 200 may not be reflected from an external light. To reduce a reflection of the external light, the light shielding member 550 may include any of light shielding materials. The light shielding materials may include carbon black, titanium nitride oxide, titanium black, phenylene black, aniline black, cyanine black, nigrosine acid black, etc. In addition, the light shielding member 550 may include a resin including any of the light shielding materials. The resin capable of being used as the light shielding member 550 together with any of the light shielding materials may include epoxy resin, acryl resin, siloxane resin, polymer resin, polyimide resin, etc.

The first light transmitting member 650 may be disposed in the peripheral region 20 on a lower surface of the second cover member 670. For example, the first light transmitting member 650 may be in direct contact with the lower surface of the second cover member 670, and may overlap the light shielding member 550 and have a second opening 655. Since the first light transmitting member 650 is disposed along the peripheral region 20, a shape of the first light transmitting member 650 may have a planar shape of a substantially athletic track. The second opening 655 may overlap with the first opening 555, and the first light transmitting member 650 may have a first color. In example embodiments, the first color may be a white color. The first light transmitting member 650 may transmit a portion of an external light, and may block a remaining portion of the external light. That is, the first light transmitting member 650 may be a transflective optical film. Since the first light transmitting member 650 has the first color, the display device 100 may be visually recognized as white in the peripheral region 20. For example, the first light transmitting member 650 may include a pigment and/or a dye. The pigment that is used in the first light transmitting member 650 may include any of azo lake organic pigments, quinacridone organic pigments, phthalocyanine organic pigments, isoindoline organic pigments, anthraquinone organic pigments, thioindigo organic pigments, chromium yellow, chromium blue, iron oxide, chromium vermilion, chromium green, ultramarine, emerald green, titanium white, carbon black, etc. These may be used alone or in a suitable combination thereof. The dye that is used in the first light transmitting member 650 may include any of azo dyes, anthraquinone dyes, benzodifuranone dyes, condensed methane dyes, etc. These may be used alone or in a suitable combination thereof. As the first light transmitting member 650 includes at least one selected from the pigments and/or the dyes, the first light transmitting member 650 may be visually recognized as the first color. In other words, the first light transmitting member 650 may be implemented as any of various colors by using the pigments and/or the dyes. Meanwhile, as the first light transmitting member 650 is disposed on a lower surface of the second cover member 670, a first stepped portion 660 may be generated.

The second light transmitting member 570 may be disposed between the first cover member 590 and the light shielding member 550 in the peripheral region 20. For example, the second light transmitting member 570 may be in direct contact with a lower surface of the first cover member 590, and the light shielding member 550 may be in direct contact with a lower surface of the second light transmitting member 570. The second light transmitting member 570 may overlap the light shielding member 550, and may have a third opening 575. Since the second light transmitting member 570 is disposed along the peripheral region 20, a shape of the second light transmitting member 570 may have a planar shape of a substantially athletic track. The third opening 575 may overlap with the first opening 555 and the second opening 655, and the second light transmitting member 570 may have the first color. The second light transmitting member 570 may transmit a portion of an external light, and may block a remaining portion of the external light. That is, the second light transmitting member 570 may be a transflective optical film. Since the second light transmitting member 570 may have the first color, the display device 100 may be visually recognized as white in the peripheral region 20. The second light transmitting member 570 may include a pigment and/or a dye. Meanwhile, as the second light transmitting member 570 and the light shielding member 550 are disposed on a lower surface of the first cover member 590, a second stepped portion 580 may be generated.

In example embodiments, the second light transmitting member 570 may be disposed so as to reduce the first stepped portion 660. For example, the display device 100 may include a light transmitting member so as to implement the first color in the peripheral region 20. The light transmitting member may have a predetermined thickness so as to implement the first color. If the light transmitting member having a relatively large thickness were disposed only on a lower surface of the second cover member 670, a thickness of the first stepped portion may be relatively increased. In this case, the second protection layer 630 may not be readily contacted to the first stepped portion due to a relatively large stepped portion, and a contact failure (or an adhesion failure) of the display device 100 may occur. Accordingly, as the display device 100 according to embodiments includes the first light transmitting member 650 and the second light transmitting member 570, the display device 100 may relatively decrease a thickness of the first stepped portion 660. In addition, as the light shielding member 550 is disposed on a lower surface of the first cover member 590, a thickness of the second light transmitting member 570 may be less than a thickness of the first light transmitting member 650 such that the thickness of the first stepped portion 660 is similar to the thickness of the first light transmitting member 650.

The first adhesive member 510 may be disposed on the display panel 200. The first adhesive member 510 may be entirely disposed in the display region 10 and the peripheral region 20 on the display panel 200, and may in direct contact with an upper surface of the display panel 200 and a lower surface of the first protection layer 530. The first adhesive member 510 may be interposed between the first protection layer 530 and the display panel 200 so as to adhere the first protection layer 530 and the display panel 200. For example, the first adhesive member 510 may include any of optical clear adhesives (OCA), pressure sensitive adhesives (PSA), etc., including acryl-based adhesives, silicon-based adhesives, urethane-based adhesives, rubber-based adhesives, vinyl ether-based adhesives, etc.

The second adhesive member 610 may be disposed on the first cover member 590. The second adhesive member 610 may be entirely disposed in the display region 10 and the peripheral region 20 on the first cover member 590, and may be in direct contact with a lower surface of the second protection layer 630 and an upper surface of the first cover member 590. The second adhesive member 610 may be interposed between the second protection layer 630 and the first cover member 590 so as to adhere the second protection layer 630 and the first cover member 590. For example, the second protection layer 630 may include OCA, PSA, etc.

The first protection layer 530 may be disposed between the first adhesive member 510 and the light shielding member 550. In example embodiments, the first protection layer 530 may fill the first opening 555 and the third opening 575, and may be in direct contact with a lower surface of the first cover member 590 and an upper surface of the first adhesive member 510 and cover the lower surface of the light shielding member 550. In addition, the first protection layer 530 may have a relatively lower viscosity than the first adhesive member 510, and may be completely (or readily) contacted in the lower surface of the first cover member 590, side walls defining the first and third openings 555 and 575 (e.g., inner surfaces of the light shielding member 550 and the second light transmitting member 570), and the lower surface of the light shielding member 550. In other words, bubbles (or air) may not be generated between the lower surface of the first cover member 590 and an upper surface of the first protection layer 530. For example, the first protection layer 530 may include a photopolymer resin such as an oligomer, a urethane acrylate, a monomer, a photoinitiator, a solvent, a ketone, etc. Accordingly, as the first protection layer 530 having a relatively low viscosity is interposed between the first cover member 590 and the first adhesive member 510 and between the light shielding member 550 and the first adhesive member 510, the display device 100 may prevent or substantially prevent an adhesion failure between the first cover member 590 and the display panel 200. In addition, the first protection layer 530 may serve as an impact absorbing layer. Accordingly, as the display device 100 includes the first protection layer 530, the display device 100 may be manufactured as a display device having an improved impact resistance.

For example, in a conventional display device, a first adhesive member may be interposed between the display panel and the first cover member without the first protection layer 530. Here, the first adhesive member may fill the first and third openings and may be disposed on the display panel. In addition, to thinly manufacture a thickness of the conventional display device, a thickness of the first adhesive member may be relatively thinly manufactured. As the thickness of the first adhesive member becomes thinner, the first adhesive member may not be in direct contact with a lower surface of the first cover member due to a second stepped portion. In other words, if the first adhesive member having a relatively higher viscosity than the first protection layer 530 were disposed on a lower surface of the light shielding member and a lower surface of the first cover member, the first adhesive member may not completely contact (or adhere) to side walls defining the first and third openings due to the second stepped portion. In this case, in a reliability inspection process, bubbles may be generated between the first adhesive member and the first cover member, and the conventional display device may be damaged due to the bubbles.

In addition, if the first adhesive member were disposed only in the first opening and the third opening (e.g., when a lower surface of the light shielding member is exposed), the display panel and the first cover member may not be completely adhered (or bonded) by the first adhesive member. In other words, as the first adhesive member is not disposed on a lower surface of the light shielding member, the light shielding member may be spaced apart from the display panel. In this case, an adhesion failure of the conventional display device may occur.

The second protection layer 630 may be disposed between the second adhesive member 610 and the first light transmitting member 650. In example embodiments, the second protection layer 630 may fill the second opening 655 and may be in direct contact with a lower surface of the second cover member 670 and an upper surface of the second adhesive member 610, and may cover a lower surface of the first light transmitting member 650. In addition, the second protection layer 630 may have a relatively lower viscosity than the second adhesive member 610, and may be completely (or readily) contacted to the lower surface of the second cover member 670, side walls defining the second opening 655 (e.g., an inner surface of the first light transmitting member 650), and the lower surface of the first light transmitting member 650. In other words, bubbles may not be generated between the lower surface of the second cover member 670 and an upper surface of the second protection layer 630. For example, the second protection layer 630 may include a photopolymer resin. Accordingly, as the second protection layer 630 having a relatively low viscosity is interposed between the second cover member 670 and the second adhesive member 610 and between the first light transmitting member 650 and the second adhesive member 610, the display device 100 may prevent or substantially prevent an adhesion failure between the second cover member 670 and the first cover member 590. In addition, the second protection layer 630 may serve as an impact absorbing layer. Accordingly, as the display device 100 includes the second protection layer 630, the display device 100 may be manufactured as a display device having an improved impact resistance.

As the display device 100 in accordance with example embodiments includes the first light transmitting member 650 and the second light transmitting member 570, the display device 100 may have the first color in the peripheral region 20, and may relatively reduce a thickness of the first stepped portion 660. In addition, as the display device 100 includes the first protection layer 530 and the second protection layer 630 that have a relatively low viscosity, the display device 100 may prevent or substantially prevent an adhesion failure, and may be manufactured as the display device 100 having an improved impact resistance.

Figure 5:
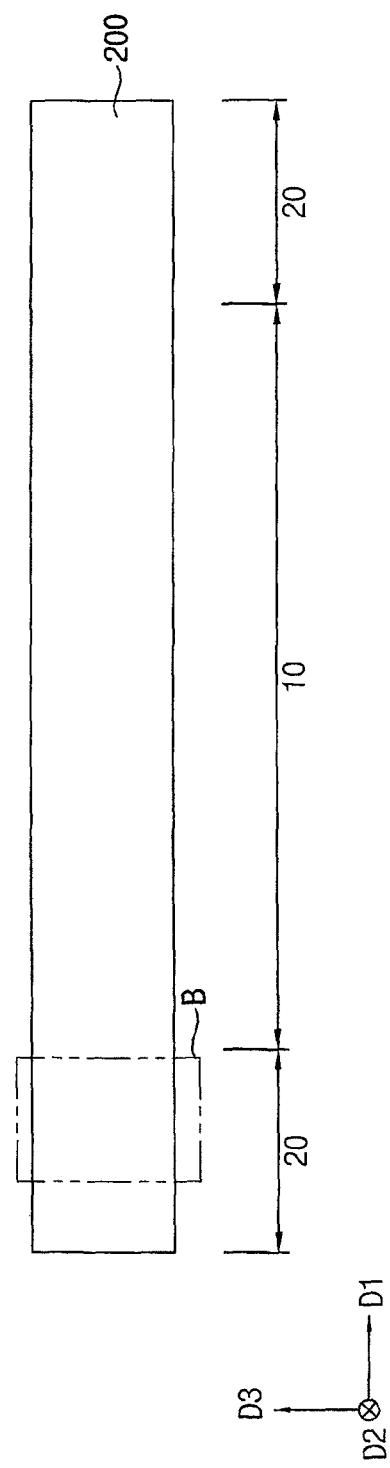
FIGS. 5, 6, 7, 8, 9, 10, 11, and 12 are cross-sectional views illustrating a method of manufacturing a display device, in accordance with example embodiments.
Figure 6:
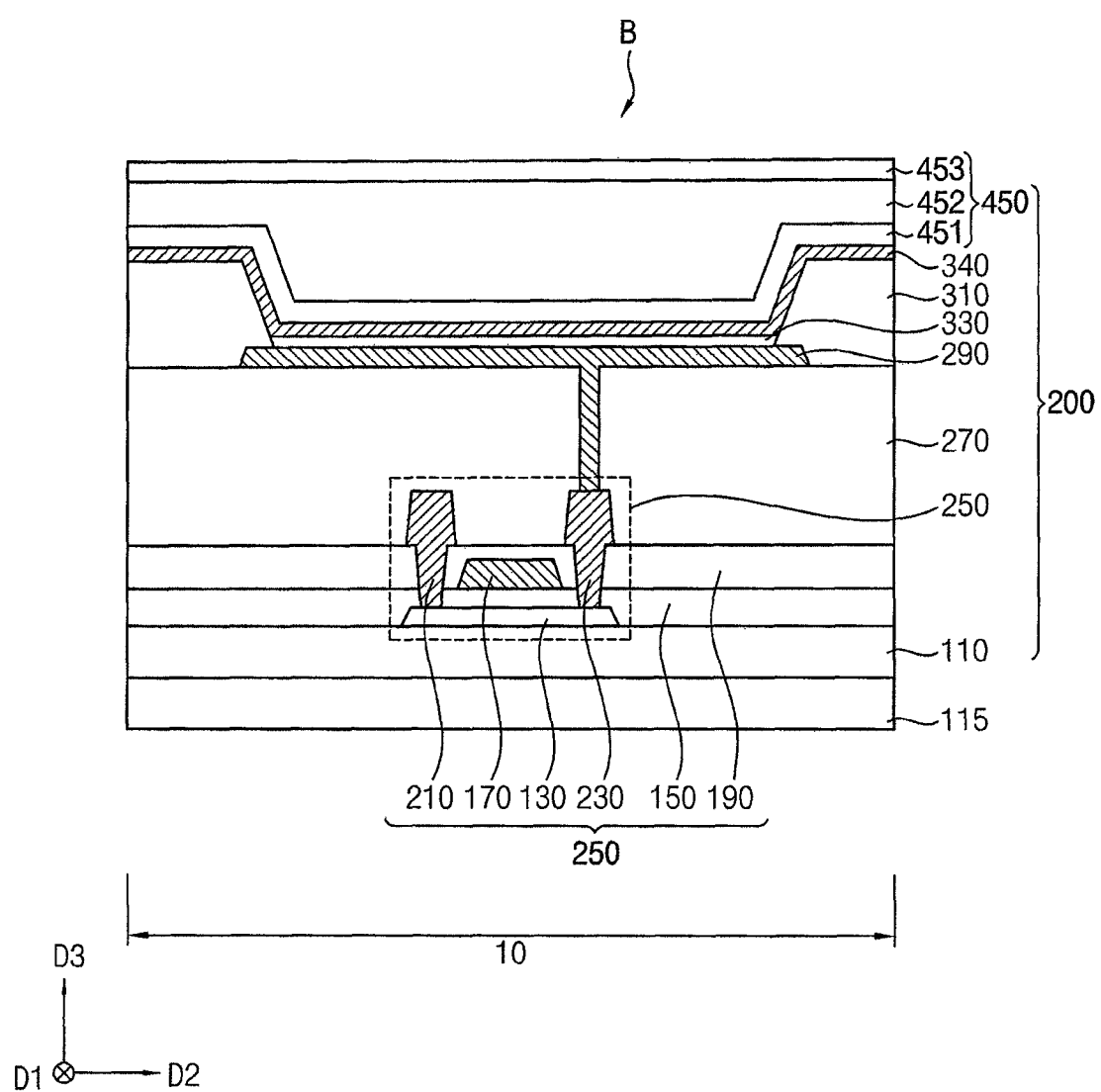

FIGS. 5, 6, 7, 8, 9, 10, 11, and 12 are cross-sectional views illustrating a method of manufacturing a display device, in accordance with example embodiments. FIG. 6 is an enlarged partial cross-sectional view corresponding to the region "B" of FIG. 5.

Referring to FIGS. 5 and 6, a display panel 200 having a display region 10 and a peripheral region 20 may be provided. A plurality of display structures may be formed in the display region 10, and the display structures may emit a light. Wirings (e.g., scan signal wirings, data signal wirings, power supply voltage wirings, etc.) may be formed in the peripheral region 20. Here, the wiring may be electrically connected to the display structures.

For example, as illustrated in FIG. 6, a substrate 110 may be formed on a glass substrate 115. The substrate 110 may be formed of a flexible transparent material, such as a flexible transparent resin substrate (e.g., a polyimide substrate).

A buffer layer (not shown) may be formed on the substrate 110. The buffer layer may be formed on the entire substrate 110. The buffer layer may prevent or substantially prevent the diffusion of metal atoms and/or impurities from the substrate 110. In addition, the buffer layer may control a rate of heat transfer in a crystallization process for forming an active layer, thereby obtaining substantially uniform the active layer. Further, the buffer layer may improve a surface flatness of the substrate 110 when a surface of the substrate 110 is relatively irregular. The buffer layer may be formed using a silicon compound, a metal oxide, etc.

An active layer 130 may be formed on the substrate 110. The active layer 130 may be formed using an oxide semiconductor, an inorganic semiconductor, an organic semiconductor, etc.

A gate insulation layer 150 may be formed on the active layer 130. The gate insulation layer 150 may cover the active layer 130, and may be formed on the substrate 110. The gate insulation layer 150 may be formed using a silicon compound, a metal oxide, etc.

A gate electrode 170 may be formed on a portion of the gate insulation layer 150 under which the active layer 130 is located. The gate electrode 170 may be formed using a metal, a metal alloy, a metal nitride, a conductive metal oxide, transparent conductive materials, etc. These may be used alone or in a suitable combination thereof. In some example embodiments, the gate electrode 170 may have a multi-layered structure.

An insulating interlayer 190 may be formed on the gate electrode 170. The insulating interlayer 190 may cover the gate electrode 170, and may be formed on the gate insulation layer 150. The insulating interlayer 190 may be formed using a silicon compound, a metal oxide, etc.

A source electrode 210 and a drain electrode 230 may be formed on the insulating interlayer 190. The source electrode 210 may be in direct contact with a first side of the active layer 130 via a contact hole formed by removing a portion of the gate insulation layer 150 and the insulating interlayer 190. The drain electrode 230 may be in direct contact with a second side of the active layer 130 via a contact hole formed by removing another portion of the gate insulation layer 150 and the insulating interlayer 190. The source electrode 210 and the drain electrode 230 may be formed using a metal, an alloy, a metal nitride, a conductive metal oxide, transparent conductive materials, etc. These may be used alone or in a suitable combination thereof. In some example embodiments, each of the source and drain electrodes 210 and 230 may have a multi-layered structure. Accordingly, a semiconductor element 250 including the active layer 130, the gate insulation layer 150, the gate electrode 170, the insulating interlayer 190, the source electrode 210, and the drain electrode 230 may be formed.

A planarization layer 270 may be formed on the source electrode 210 and the drain electrode 230. The planarization layer 270 may cover the source electrode 210 and the drain electrode 230, and may be formed on the entire insulating interlayer 190. In example embodiments, the planarization layer 270 may be formed to have a high thickness to sufficiently cover the source and drain electrodes 210 and 230. In this case, the planarization layer 270 may have a substantially flat upper surface, and a planarization process may be further performed on the planarization layer 270 to implement the flat upper surface of the planarization layer 270. The planarization layer 270 may be formed using organic materials.

A lower electrode 290 may be formed on the planarization layer 270. The lower electrode 290 may be in contact with the drain electrode 230 via a contact hole formed by removing a portion of the planarization layer 270. The lower electrode 290 may be formed using a metal, a metal alloy, a metal nitride, a conductive metal oxide, transparent conductive materials, etc. These may be used alone or in a suitable combination thereof. In some example embodiments, the lower electrode 290 may have a multi-layered structure.

A pixel defining layer 310 may be formed on the planarization layer 270 and may expose a portion of the lower electrode 290. The pixel defining layer 310 may be formed using organic materials.

A light emitting layer 330 may be formed in a portion where the portion of the lower electrode 290 is exposed. The light emitting layer 330 may be formed using at least one of light emitting materials capable of generating different colors of light (e.g., a red color of light, a blue color of light, and a green color of light, etc.) according to sub-pixels. Alternatively, the light emitting layer 330 may generally generate a white color of light by stacking a plurality of light emitting materials capable of generating different colors of light, such as a red color of light, a green color of light, a blue color of light, etc. In this case, a color filter may be formed on the light emitting layer 330. The color filter may include at least one selected from a red color filter, a green color filter, and a blue color filter. Alternatively, the color filter may include a yellow color filter, a cyan color filter, and a magenta color filter. The color filter may be formed using a photosensitive resin (or color photoresist), etc.

An upper electrode 340 may be formed on the pixel defining layer 310 and the light emitting layer 330. The upper electrode 340 may be formed using a metal, a metal alloy, a metal nitride, a conductive metal oxide, transparent conductive materials, etc. These may be used alone or in a suitable combination thereof. In some example embodiments, the upper electrode 340 may have a multi-layered structure.

A first thin film encapsulation (TFE) layer 451 may be formed on the upper electrode 340. The first TFE layer 451 may cover the upper electrode 340, and may be formed to have a substantially uniform thickness along a profile of the upper electrode 340. The first TFE layer 451 may prevent or substantially prevent a light emitting structure (e.g., the lower electrode 290, the light emitting layer 330, the upper electrode 340, etc.) from being deteriorated by the permeation of moisture, water, oxygen, etc. In addition, the first TFE layer 451 may protect the light emitting structure from external impacts. The first TFE layer 451 may be formed using inorganic materials.

A second TFE layer 452 may be formed on the first TFE layer 451. The second TFE layer 452 may improve the flatness of the display panel 200, and may protect the light emitting structure. The second TFE layer 452 may be formed using organic materials.

A third TFE layer 453 may be formed on the second TFE layer 452. The third TFE layer 453 may cover the second TFE layer 452, and may be formed to have a substantially uniform thickness along a profile of the second TFE layer 452. The third TFE layer 453, together with the first TFE layer 451 and the second TFE layer 452, may prevent or substantially prevent the light emitting structure from being deteriorated by the permeation of moisture, water, oxygen, etc. In addition, the third TFE layer 453, together with the first TFE layer 451 and the second TFE layer 452, may protect the light emitting structure from external impacts. The third TFE layer 453 may be formed using inorganic materials. Accordingly, a TFE structure 450 including the first TFE layer 451, the second TFE layer 452, and the third TFE layer 453 may be formed. In addition, the display panel 200 including the substrate 110, the semiconductor element 250, the planarization layer 270, the lower electrode 290, the pixel defining layer 310, the light emitting layer 330, the upper electrode 340, and the TFE structure 450 may be formed.

After the semiconductor element 250, the planarization layer 270, the light emitting structure, the TFE structure 450, etc. are formed on the substrate 110, the glass substrate 115 may be removed from the substrate 110.

Figure 7:
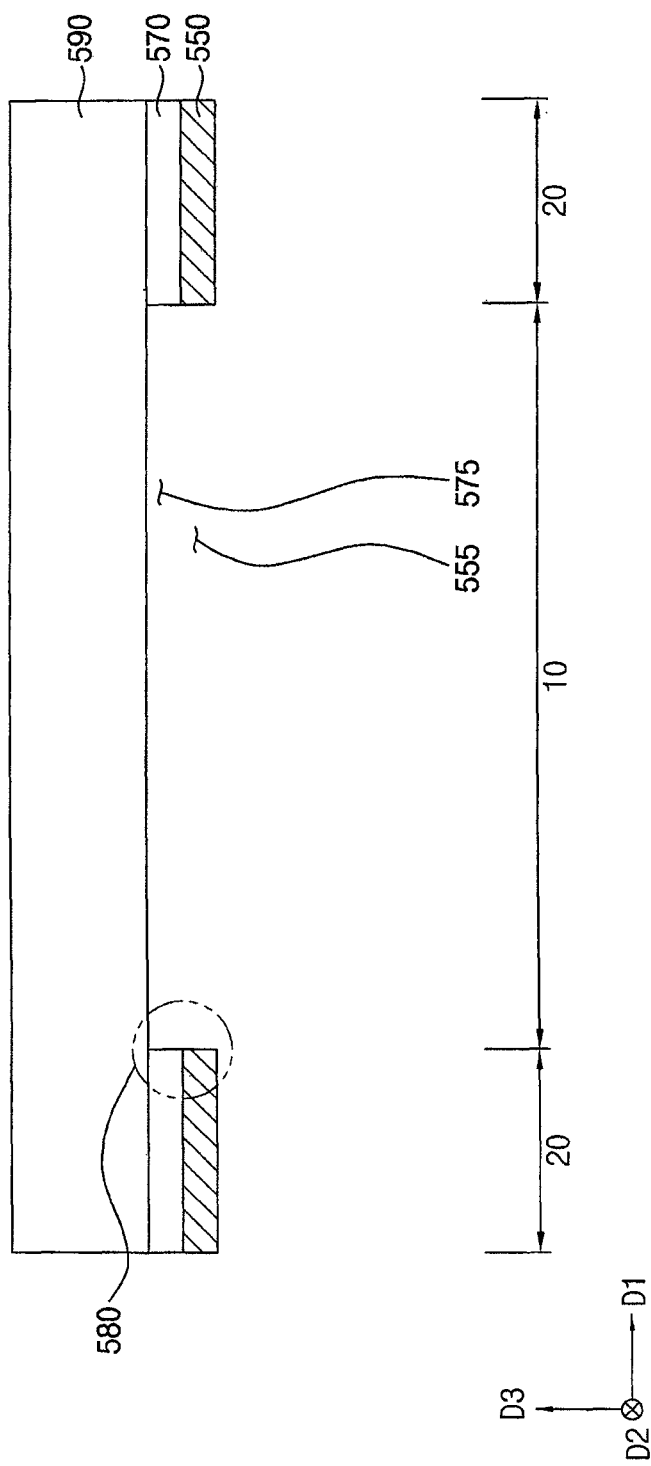

Referring to FIG. 7, a first cover member 590 may be provided. The first cover member 590 may be located in the display region 10 and the peripheral region 20 on the display panel 200. In example embodiments, the first cover member 590 may have a multi-layered structure. For example, the first cover member 590 may include protection coating layers and base film layers, etc. that include organic materials or inorganic materials. The protection coating layer may be formed on the base film layer, and a viscosity of the protection coating layer may be greater than a viscosity of the base film layer such that the protection coating layer protects the base film layer. The base film layer may be formed using polyimide, PET, PEN, PP, PC, PS, PSul, PE, PPA, PES, PAR, PCO, MPPO, TPU, etc. In addition, the protection coating layer may be formed using acryl-based materials, epoxy-based materials, etc.

A second light transmitting member 570 may be formed in the peripheral region 20 on a lower surface of the first cover member 590. The second light transmitting member 570 may be in direct contact with a lower surface of the first cover member 590, and may have a third opening 575. The second light transmitting member 570 is formed along the peripheral region 20, and a shape of the second light transmitting member 570 may have a planar shape of a substantially athletic track. The third opening 575 may expose the display region 10, and the second light transmitting member 570 may have a first color. In example embodiments, the first color may have a white color. The second light transmitting member 570 may transmit a portion of an external light, and may block a remaining portion of the external light. That is, the second light transmitting member 570 may be a transflective optical film. The second light transmitting member 570 may be formed using a pigment and/or a dye. The pigment that is used in the second light transmitting member 570 may include any of azo lake organic pigments, quinacridone organic pigments, phthalocyanine organic pigments, isoindoline organic pigments, anthraquinone organic pigments, thioindigo organic pigments, chromium yellow, chromium blue, iron oxide, chromium vermilion, chromium green, ultramarine, emerald green, titanium white, carbon black, etc. These may be used alone or in a suitable combination thereof. The dye that is used in the second light transmitting member 570 may include any of azo dyes, anthraquinone dyes, benzodifuranone dyes, condensed methane dyes, etc. These may be used alone or in a suitable combination thereof. As the second light transmitting member 570 includes at least one selected from the pigments and/or the dyes, the second light transmitting member 570 may be visually recognized as the first color. In other words, the second light transmitting member 570 may be implemented as any of various colors by using the pigments and/or the dyes.

A light shielding member 550 may be formed in the peripheral region 20 on a lower surface of the second light transmitting member 570.

For example, the light shielding member 550 may be in direct contact with the lower surface of the second light transmitting member 570, and may overlap with the second light transmitting member 570. In addition, the light shielding member 550 may have a first opening 555, and the first opening 555 may overlap with the third opening 575. That is, the first opening 555 may expose the display region 10, and an image of the display panel 200 may be displayed via the first and third openings 555 and 575. In other words, the light shielding member 550 is formed along the peripheral region 20, and a shape of the light shielding member 550 may have a planar shape of a substantially athletic track. As the light shielding member 550 is formed in the peripheral region 20, a plurality of wirings that are formed in the peripheral region 20 of the display panel 200 may not be reflected from an external light. To reduce a reflection of the external light, the light shielding member 550 may include light shielding materials. The light shielding materials may be formed using any of carbon black, titanium nitride oxide, titanium black, phenylene black, aniline black, cyanine black, nigrosine acid black, etc. In addition, the light shielding member 550 may include a resin including the light shielding materials. The resin capable of being used as the light shielding member 550 together with the light shielding materials may include epoxy resin, acryl resin, siloxane resin, polymer resin, polyimide resin, etc. Meanwhile, as the second light transmitting member 570 and the light shielding member 550 are formed on a lower surface of the first cover member 590, a second stepped portion 580 may be generated.

Figure 8:
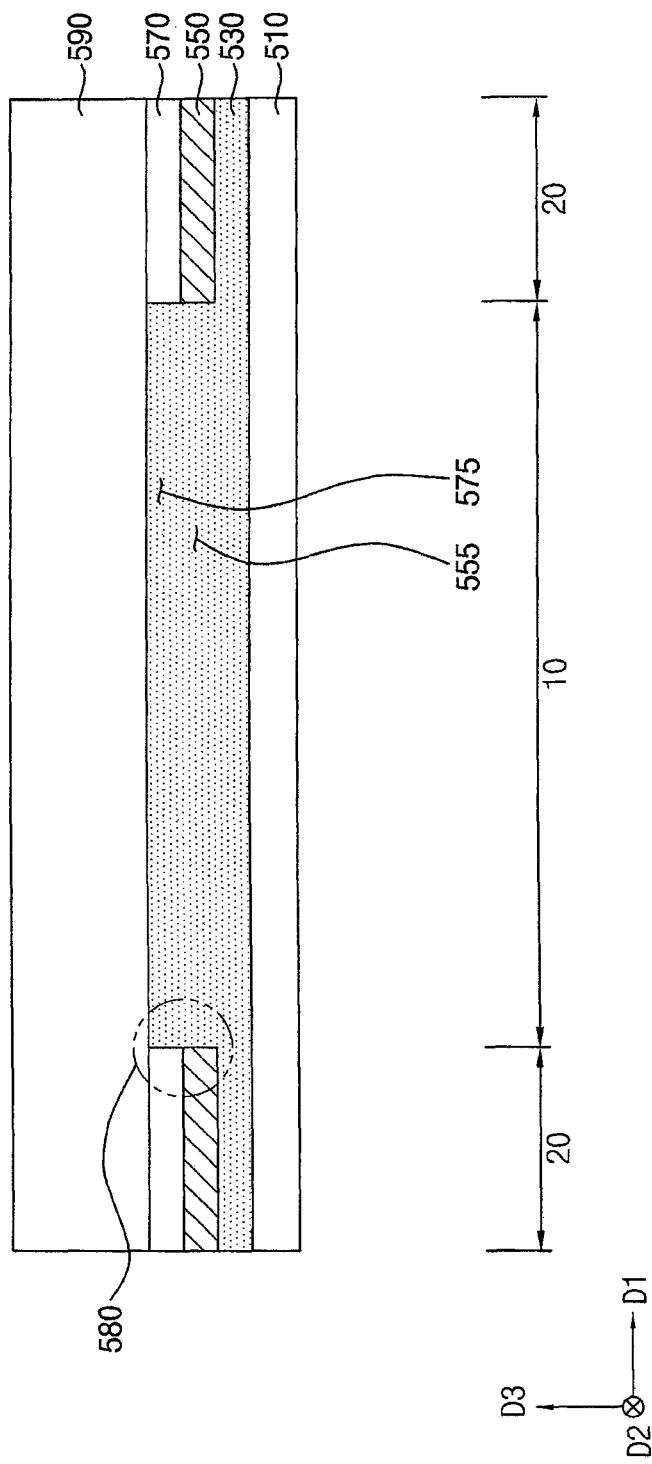

Referring to FIG. 8, a first protection layer 530 may be formed on a lower surface of the first cover member 590 and a lower surface of the light shielding member 550. In example embodiments, the first protection layer 530 may fill the first opening 555 and the third opening 575, and may be in direct contact with a lower surface of the first cover member 590 and cover the lower surface of the light shielding member 550. In addition, the first protection layer 530 may have a relatively lower viscosity than a first adhesive member 510 that will be described below, and may be completely (or readily) contacted in the lower surface of the first cover member 590, side walls defining the first and third openings 555 and 575 (e.g., inner surfaces of the light shielding member 550 and the second light transmitting member 570), and the lower surface of the light shielding member 550. In other words, the first protection layer 530 may be formed between the lower surface of the first cover member 590 and an upper surface of the first adhesive member 510 without an empty space. For example, the first protection layer 530 may be formed using a photopolymer resin such as an oligomer, a urethane acrylate, a monomer, a photoinitiator, a solvent, a ketone, etc. Accordingly, as the first protection layer 530 having a relatively low viscosity is formed in the lower surface of the first cover member 590, the side walls defining the first and third openings 555 and 575, and between the lower surface of the first cover member 590 and the upper surface of the first adhesive member 510 without the empty space, an adhesion failure may be prevented or substantially prevented. In addition, the first protection layer 530 may serve as an impact absorbing layer.

The first adhesive member 510 may be formed on a lower surface of the first protection layer 530. The first adhesive member 510 may be entirely formed in the display region 10 and the peripheral region 20 so as to adhere the first protection layer 530 and the display panel 200, and may be in direct contact with the lower surface of the first protection layer 530. For example, the first adhesive member 510 may be formed using OCA, PSA, etc., including acryl-based adhesives, silicon-based adhesives, urethane-based adhesives, rubber-based adhesives, vinyl ether-based adhesives, etc.

Figure 9:
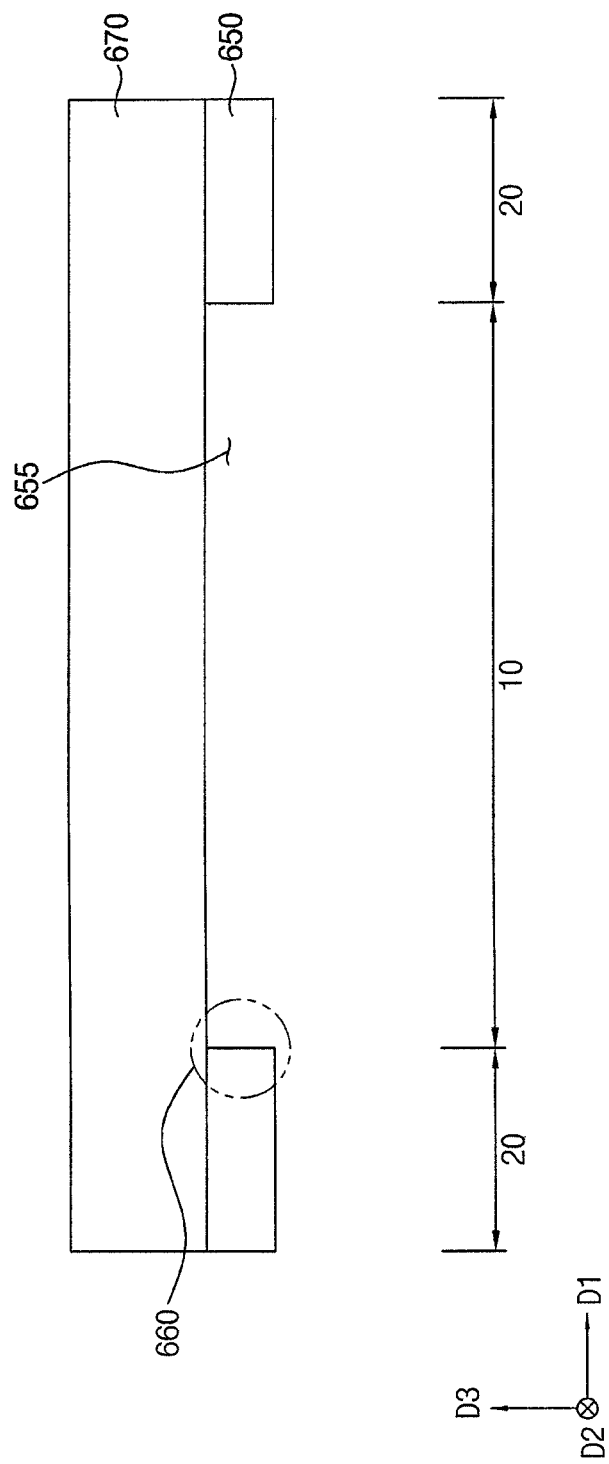

Referring to FIG. 9, a second cover member 670 may be provided. The second cover member 670 may be located in the display region 10 and the peripheral region 20 on the display panel 200. The second cover member 670 may protect the first cover member 590 and the display panel 200. In example embodiments, the second cover member 670 may have a multi-layered structure. The second cover member 670 may include protection coating layers and base film layers, etc. that include organic materials or inorganic materials.

A first light transmitting member 650 may be formed in the peripheral region 20 on a lower surface of the second cover member 670. For example, the first light transmitting member 650 may be in direct contact with the lower surface of the second cover member 670, and may have a second opening 655.

The first light transmitting member 650 is formed along the peripheral region 20, and a shape of the first light transmitting member 650 may have a planar shape of a substantially athletic track. The second opening 655 may overlap with the first and third openings 555 and 575, and the first light transmitting member 650 may have the first color. In example embodiments, the first color may be a white color. The first light transmitting member 650 may transmit a portion of an external light, and may block a remaining portion of the external light. That is, the first light transmitting member 650 may be a transflective optical film. For example, the first light transmitting member 650 may be formed using a pigment and/or a dye. As the first light transmitting member 650 includes at least one selected from the pigments and/or the dyes, the first light transmitting member 650 may be visually recognized as the first color. In other words, the first light transmitting member 650 may be implemented as any of various colors by using the pigments and/or the dyes. Meanwhile, as the first light transmitting member 650 is formed on a lower surface of the second cover member 670, a first stepped portion 660 may be generated.

Figure 10:
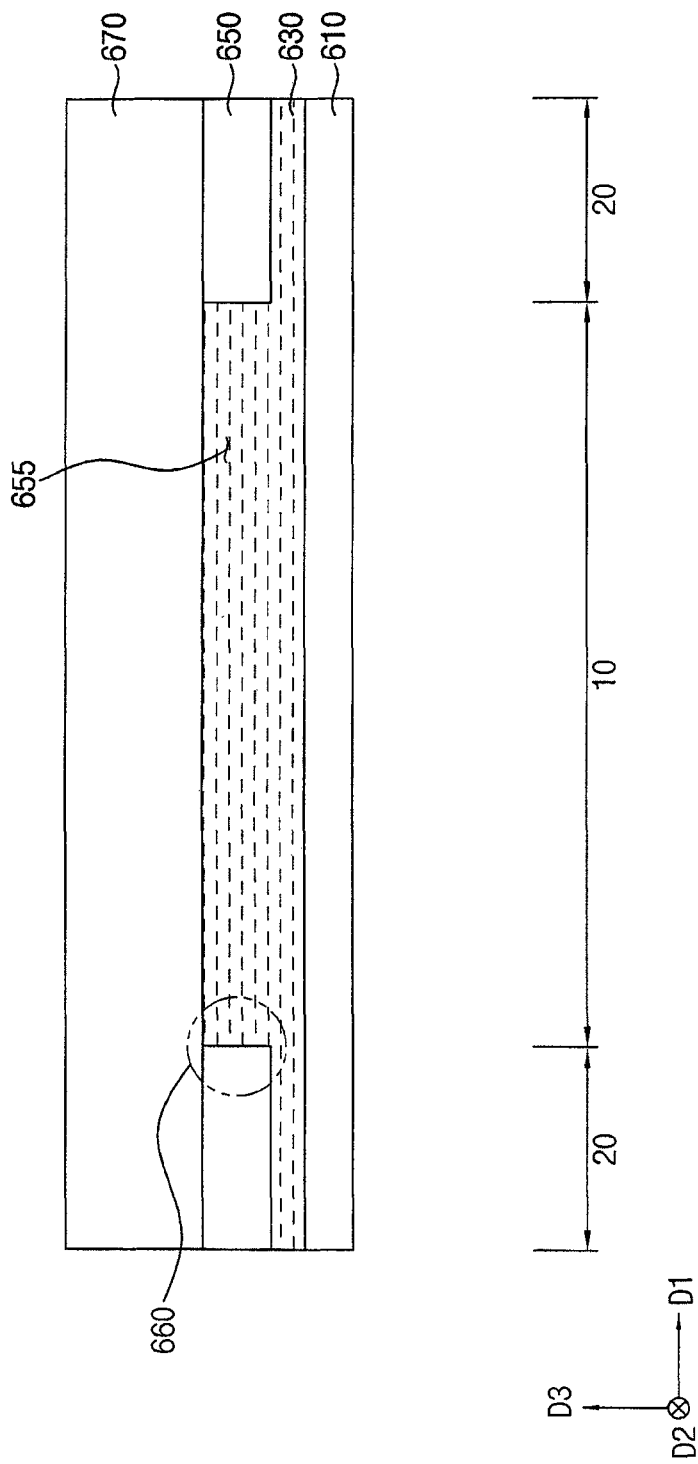

Referring to FIG. 10, a second protection layer 630 may be formed on a lower surface of the second cover member 670 and a lower surface of the first light transmitting member 650. In example embodiments, the second protection layer 630 may fill the second opening 655 and may be in direct contact with the lower surface of the second cover member 670, and may cover the lower surface of the first light transmitting member 650. In addition, the second protection layer 630 may have a relatively lower viscosity than a second adhesive member 610 that will be described below, and may be completely (or readily) contacted to the lower surface of the second cover member 670, side walls defining the second opening 655 (e.g., an inner surface of the first light transmitting member 650), and the lower surface of the first light transmitting member 650. In other words, the second protection layer 630 may be formed between the lower surface of the second cover member 670 and an upper surface of the second adhesive member 610 without an empty space. For example, the second protection layer 630 may be formed using a photopolymer resin. Accordingly, as the second protection layer 630 having a relatively low viscosity is formed between the lower surface of the second cover member 670 and an upper surface of the second adhesive member 610 without the empty space, an adhesion failure may be prevented or substantially prevented. In addition, the second protection layer 630 may serve as an impact absorbing layer.

The second adhesive member 610 may be formed on a lower surface of the second protection layer 630. The second adhesive member 610 may be entirely formed in the display region 10 and the peripheral region 20 so as to adhere the second protection layer 630 and the first cover member 590, and may be in direct contact with the lower surface of the second protection layer 630. For example, the second adhesive member 610 may be formed using OCA, PSA, etc.

Figure 11:
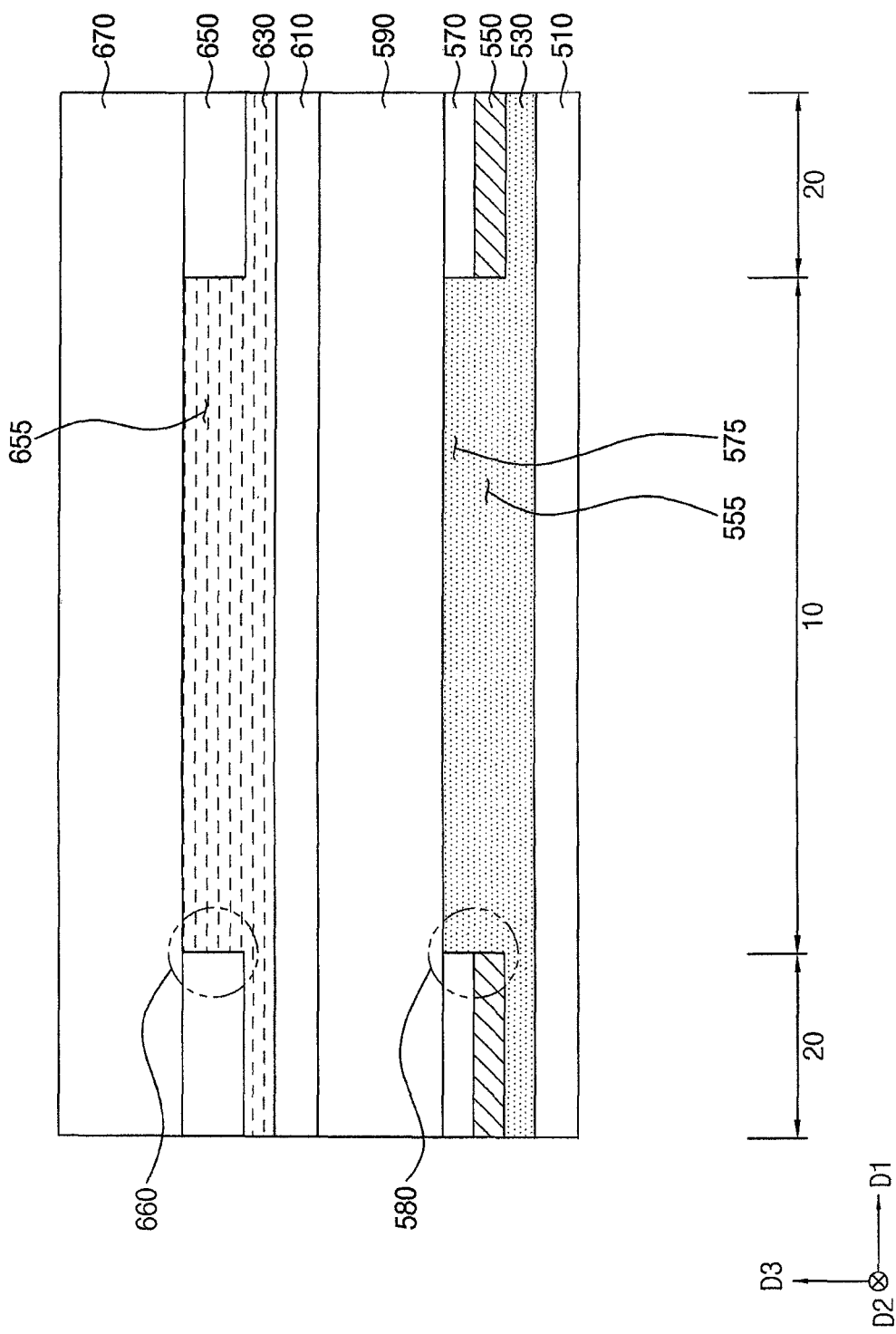

Referring to FIG. 11, the second cover member 670, the first light transmitting member 650, and the second protection layer 630 may be attached (or bonded) on the first cover member 590 by using the second adhesive member 610.

Figure 12:
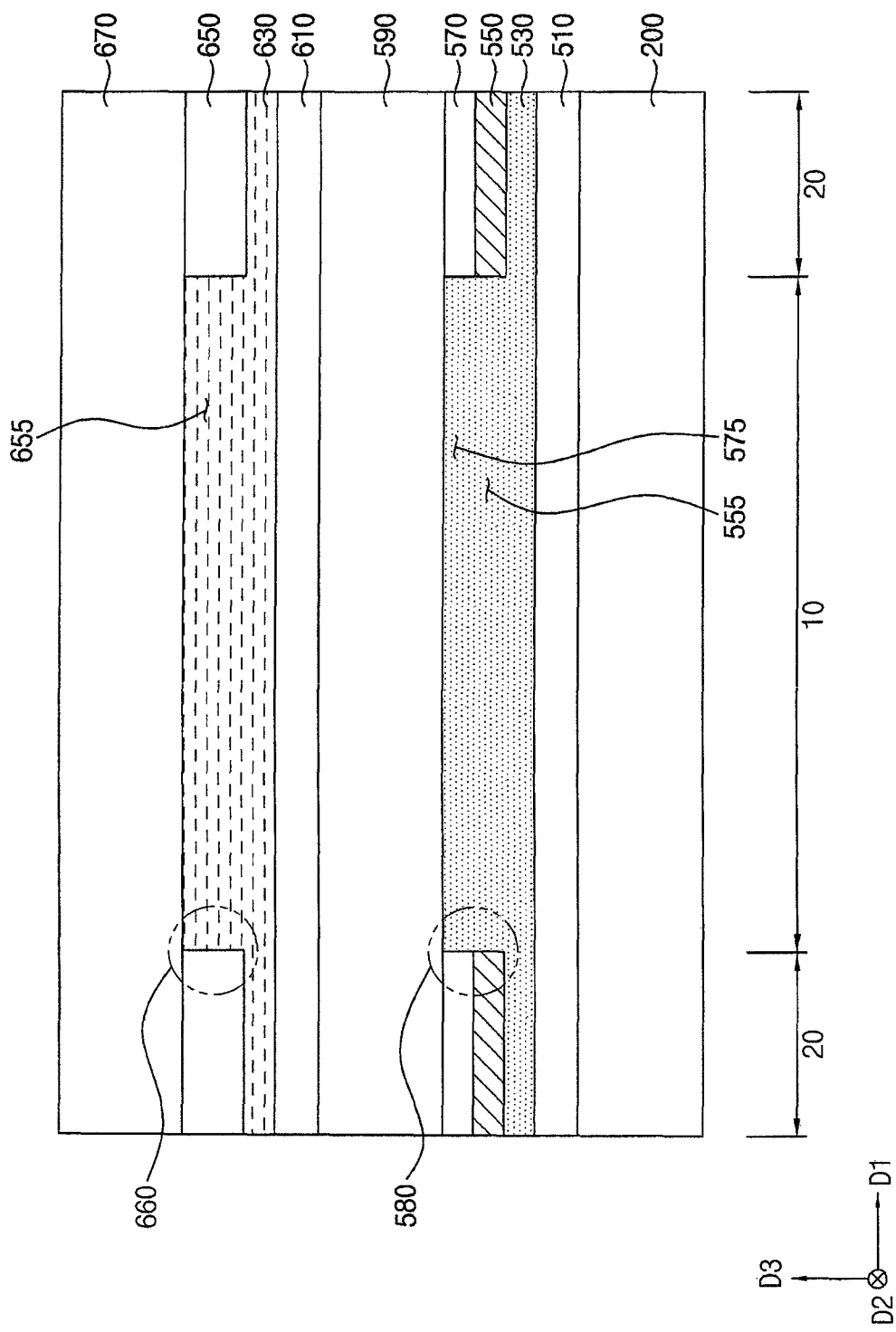

Referring to FIG. 12, the second cover member 670, the first light transmitting member 650, the second protection layer 630, the second adhesive member 610, the first cover member 590, the second light transmitting member 570, the light shielding member 550, and the first protection layer 530 may be bonded on the display panel 200 by using the first adhesive member 510. Accordingly, a display device, such as the display device 100 illustrated in FIG. 3, may be manufactured.

Figure 13:
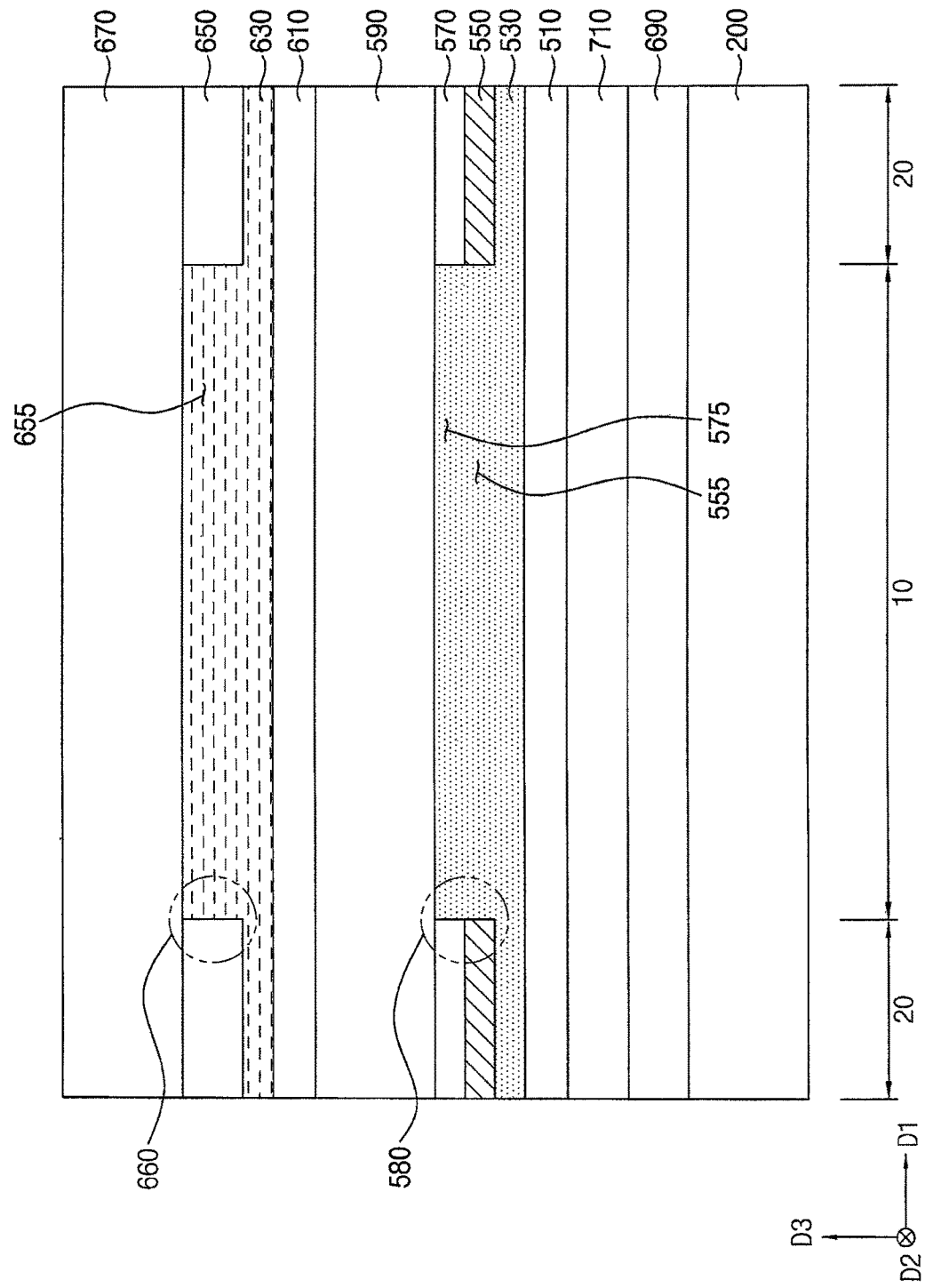
FIG. 13 is a cross-sectional view illustrating a display device in accordance with example embodiments.

FIG. 13 is a cross-sectional view illustrating a display device in accordance with example embodiments. A display device 700 illustrated in FIG. 13 may have a configuration substantially the same as or similar to that of the display device 100 described above with reference to FIGS. 1, 2, 3, and 4 except for a polarizing layer 690 and a touch screen electrode layer 710. In FIG. 13, further detailed descriptions for elements that are substantially the same as or similar to elements described with reference to FIGS. 1, 2, 3, and 4 may not be repeated.

Referring to FIG. 13, the display device 700 may include a display panel 200, the polarizing layer 690, the touch screen electrode layer 710, a first adhesive member 510, a first protection layer 530, a light shielding member 550, a second light transmitting member 570, a first cover member 590, a second adhesive member 610, a second protection layer 630, a first light transmitting member 650, a second cover member 670, etc. The display device 700 may display an image in a display region 10, and may have a color (e.g., a predetermined color) in a peripheral region 20. In addition, the display panel 200 may be manufactured as a flexible display panel. Accordingly, the display device 700 may serve as a flexible display device having the color (e.g., the predetermined color) in the peripheral region 20.

The polarizing layer 690 may be disposed on the display panel 200. The polarizing layer 690 may include a linearly polarized film and a λ/4 phase retardation film. For example, the λ/4 phase retardation film may be disposed on the display panel 200. The λ/4 phase retardation film may convert a phase of the light. For example, the λ/4 phase retardation film may convert the light vibrating up and down or the light vibrating left and right into right-circularly polarized light or left-circularly polarized light, respectively. In addition, the λ/4 phase retardation film may convert the right-circularly polarized light or the left-circularly polarized light into the light vibrating up and down or the light vibrating left and right, respectively. The λ/4 phase retardation film may include a birefringent film containing polymer, an orientation film of a liquid crystal polymer, alignment layer of a liquid crystal polymer, etc.

The linearly polarized film may be disposed on the λ/4 phase retardation film. The linearly polarized film may selectively transmit the incident light. For example, the linearly polarized film may transmit the light vibrating up and down or vibrating left and right. In this case, the linearly polarized film may include a pattern of horizontal stripes or vertical stripes. When the linearly polarized film includes a pattern of horizontal stripes, the linearly polarized film may block the light vibrating up and down, and may transmit the light vibrating left and right. When the linearly polarized film includes a pattern of vertical stripes, the linearly polarized film may block the light vibrating left and right, and may transmit the light vibrating up and down. The light transmitting the linearly polarized film may transmit the λ/4 phase retardation film. As described above, the λ/4 phase retardation film may convert a phase of the light. For example, when the incident light vibrating up, down, left, and right passes through the linearly polarized film, the linearly polarized film including a pattern of the horizontal stripes may transmit the light vibrating left and right. When the incident light vibrating left and right passes through the λ/4 phase retardation film, the incident light vibrating left and right may be converted into the left-circularly polarized light. The incident light including the left-circularly polarized light may be reflected from the upper electrode 340, and then the incident light may be converted into the right-circularly polarized light. When the incident light including the right-circularly polarized light passes through the λ/4 phase retardation film, the incident light may be converted into the light vibrating up and down. Here, the light vibrating up and down may be blocked by the linearly polarized film including a pattern of the horizontal stripes. Accordingly, the incident light may be removed by the linearly polarized film and the λ/4 phase retardation film (i.e. the polarizing layer 690). For example, the linearly polarized film may include iodine-based materials, materials containing dye, polyene-based materials, etc.

The touch screen electrode layer 710 may be disposed on the polarizing layer 690. The touch screen electrode layer 710 may include a bottom polyethylene terephthalate (PET) film, touch screen electrodes, and a top PET film, etc. The bottom PET film and the top PET film may protect the touch screen electrodes. For example, each of the top PET film and the bottom PET film may include PET, PEN, PP, PC, PS, PSul, PE, PPA, PES, PAR, PCO, MPPO, etc. The touch screen electrodes may substantially have a metal mesh structure. For example, the touch screen electrodes may include carbon nanotube (CNT), transparent conductive oxide (TCO), ITO, indium gallium zinc oxide (IGZO), ZnO, graphene, silver nanowire (AgNW), Cu, Cr, etc.

In some example embodiments, the touch screen electrode layer 710 may be disposed on the display panel 200, and the polarizing layer 690 may be disposed on the touch screen electrode layer 710. In this case, the touch screen electrodes may be disposed directly on the TFE structure 450 without the bottom PET film.

FIGS. 14, 15, 16, 17, and 18 are cross-sectional views illustrating a display device in accordance with example embodiments. Display devices 800, 900, 1000, 1100, and 1200 illustrated in FIGS. 14, 15, 16, 17, and 18, respectively, may have a configuration substantially the same as or similar to that of the display device 100 described above with reference to FIGS. 1, 2, 3, and 4. In FIGS. 14, 15, 16, 17, and 18, further detailed descriptions for elements that are substantially the same as or similar to elements described with reference to FIGS. 1, 2, 3, and 4 may not be repeated.

Figure 14:
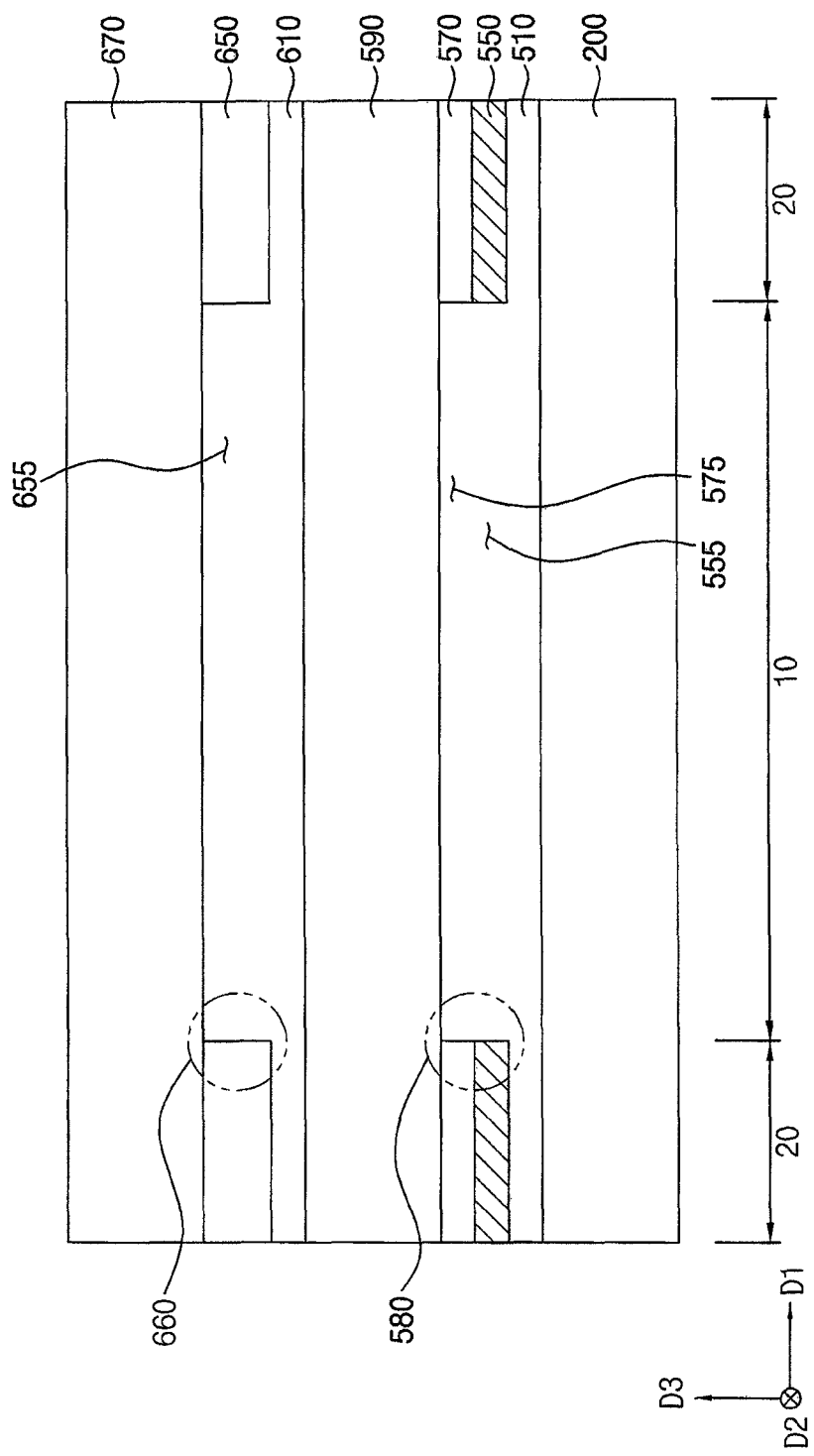
FIG. 14 is a cross-sectional view illustrating a display device in accordance with example embodiments.

Referring to FIG. 14, the display device 800 may include a display panel 200, a first adhesive member 510, a light shielding member 550, a second light transmitting member 570, a first cover member 590, a second adhesive member 610, a first light transmitting member 650, and a second cover member 670. The display device 800 may display an image in a display region 10, and may have a color (e.g., a predetermined color) in a peripheral region 20. In addition, the display panel 200 may be manufactured as a flexible display panel. Accordingly, the display device 800 may serve as a flexible display device having the color (e.g., the predetermined color) in the peripheral region 20.

The first adhesive member 510 may be disposed between the display panel 200 and the light shielding member 550. In example embodiments, the first adhesive member 510 may fill a first opening 555 and a third opening 575 and may be in direct contact with a lower surface of the first cover member 590 and an upper surface of the display panel 200, and may cover a lower surface of the light shielding member 550. In addition, the first adhesive member 510 may have a relatively low viscosity, and may be readily contacted to the lower surface of the first cover member 590, side walls defining the first and third openings 555 and 575, and the lower surface of the light shielding member 550. In other words, bubbles may not be generated between the lower surface of the first cover member 590 and the upper surface of the first adhesive member 510. For example, the first adhesive member 510 may include OCA, PSA, etc. having a relatively low viscosity.

The second adhesive member 610 may be disposed between the first cover member 590 and the first light transmitting member 650. In example embodiments, the second adhesive member 610 may fill the second opening 655 and may be in direct contact with a lower surface of the second cover member 670 and an upper surface of the first cover member 590, and may cover a lower surface of the first light transmitting member 650. In addition, the second adhesive member 610 may have a relatively low viscosity, and may be readily contacted to the lower surface of the second cover member 670, side walls defining the second opening 655, and the lower surface of the first light transmitting member 650. In other words, bubbles may not be generated between the lower surface of the second cover member 670 and the upper surface of the second adhesive member 610. For example, the second adhesive member 610 may include OCA, PSA, etc. having a relatively low viscosity.

As the display device 800 in accordance with example embodiments includes the first adhesive member 510 and the second adhesive member 610 that have a relatively low viscosity, a thickness of the display device 800 may be relatively decreased.

Figure 15:
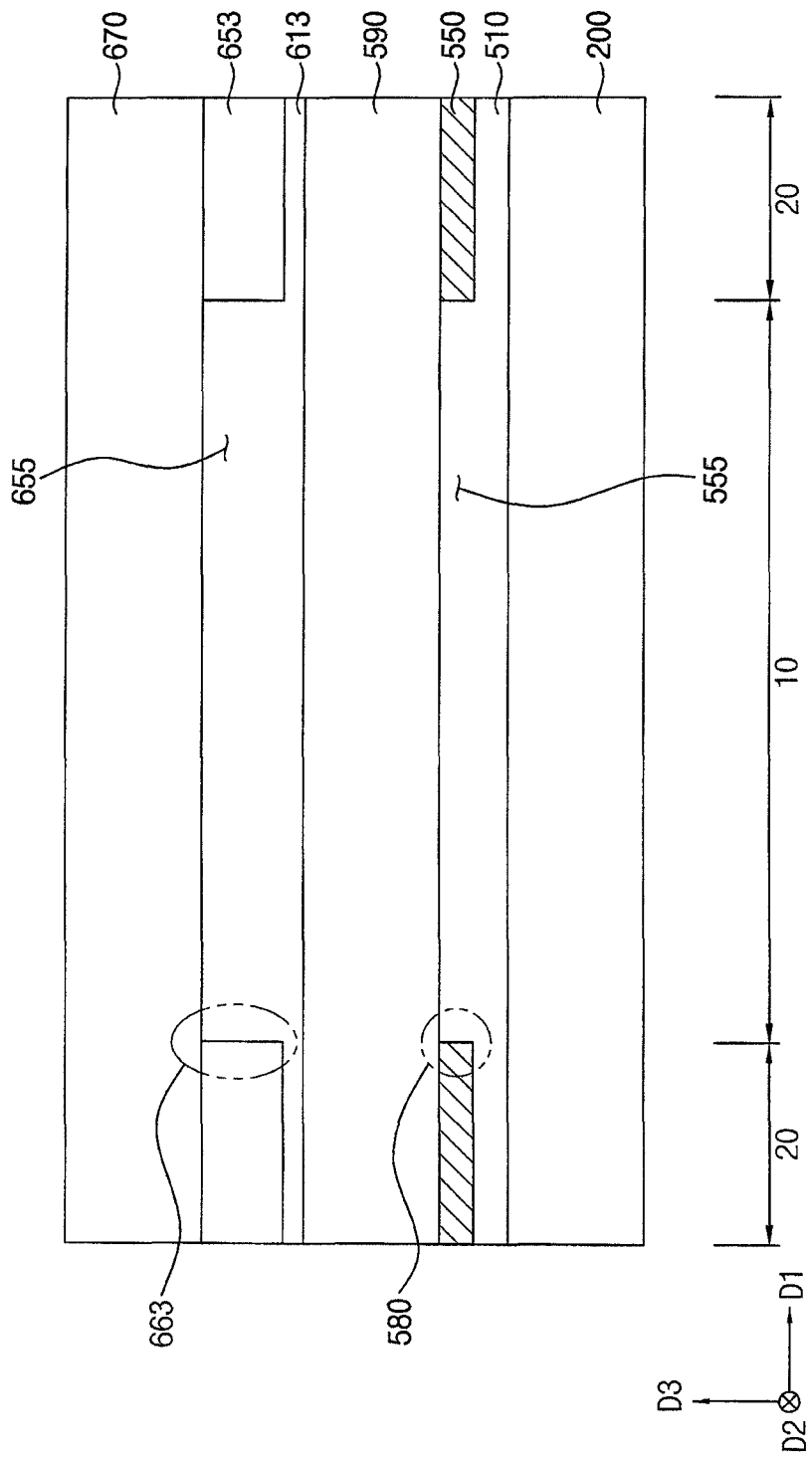
FIG. 15 is a cross-sectional view illustrating a display device in accordance with example embodiments.

Referring to FIG. 15, the display device 900 may include a display panel 200, a first adhesive member 510, a light shielding member 550, a first cover member 590, a second adhesive member 613, a first light transmitting member 653, and a second cover member 670.

Compared to the display device 800 described above, the display device 900 may not include the second light transmitting member 570. In this case, the first light transmitting member 653 may have a relatively larger thickness than a thickness of the first light transmitting member 650 of the display device 800 of FIG. 14 so as to have a first color, and a first stepped portion 663 may be generated. Thus, the display device 900 may include the second adhesive member 613 having a relatively lower viscosity than a viscosity of the second adhesive member 610 of the display device 800 such that the second adhesive member 613 is readily contacted to a lower surface of the first light transmitting member 653 having a relatively large thickness, side walls defining a second opening 655, and a lower surface of the second cover member 670.

Figure 16:
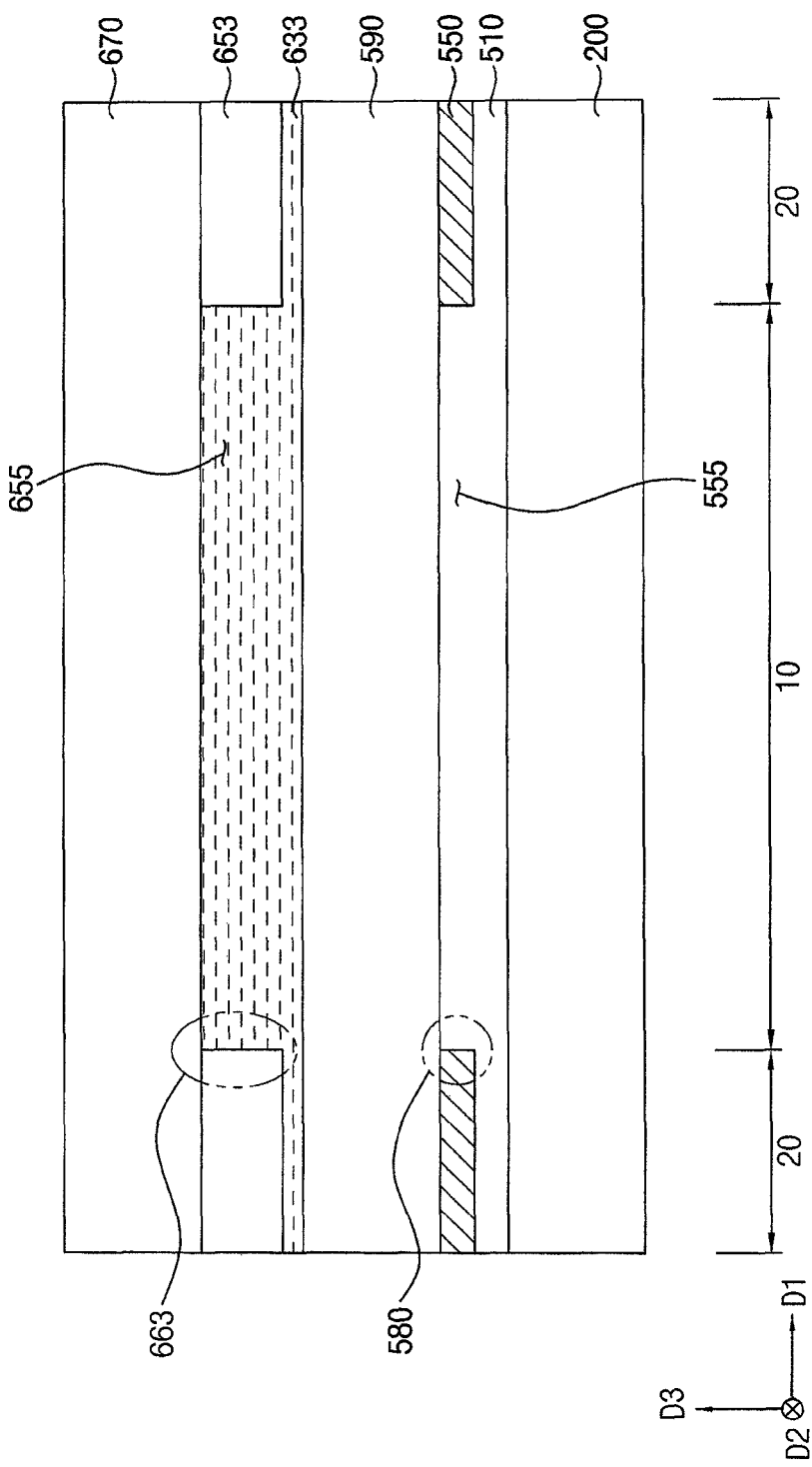
FIG. 16 is a cross-sectional view illustrating a display device in accordance with example embodiments.

Referring to FIG. 16, a display device 1000 may include a display panel 200, a first adhesive member 510, a light shielding member 550, a first cover member 590, a second protection layer 633, a first light transmitting member 653, and a second cover member 670.

Compared to the display device 900 described above, the display device 1000 may include the second protection layer 633 instead of the second adhesive member 613. In this case, the second protection layer 633 may have a relatively higher adhesive strength than the second protection layer 630 included in the display device 100 so as to adhere the second protection layer 633 and the first cover member 590.

Figure 17:
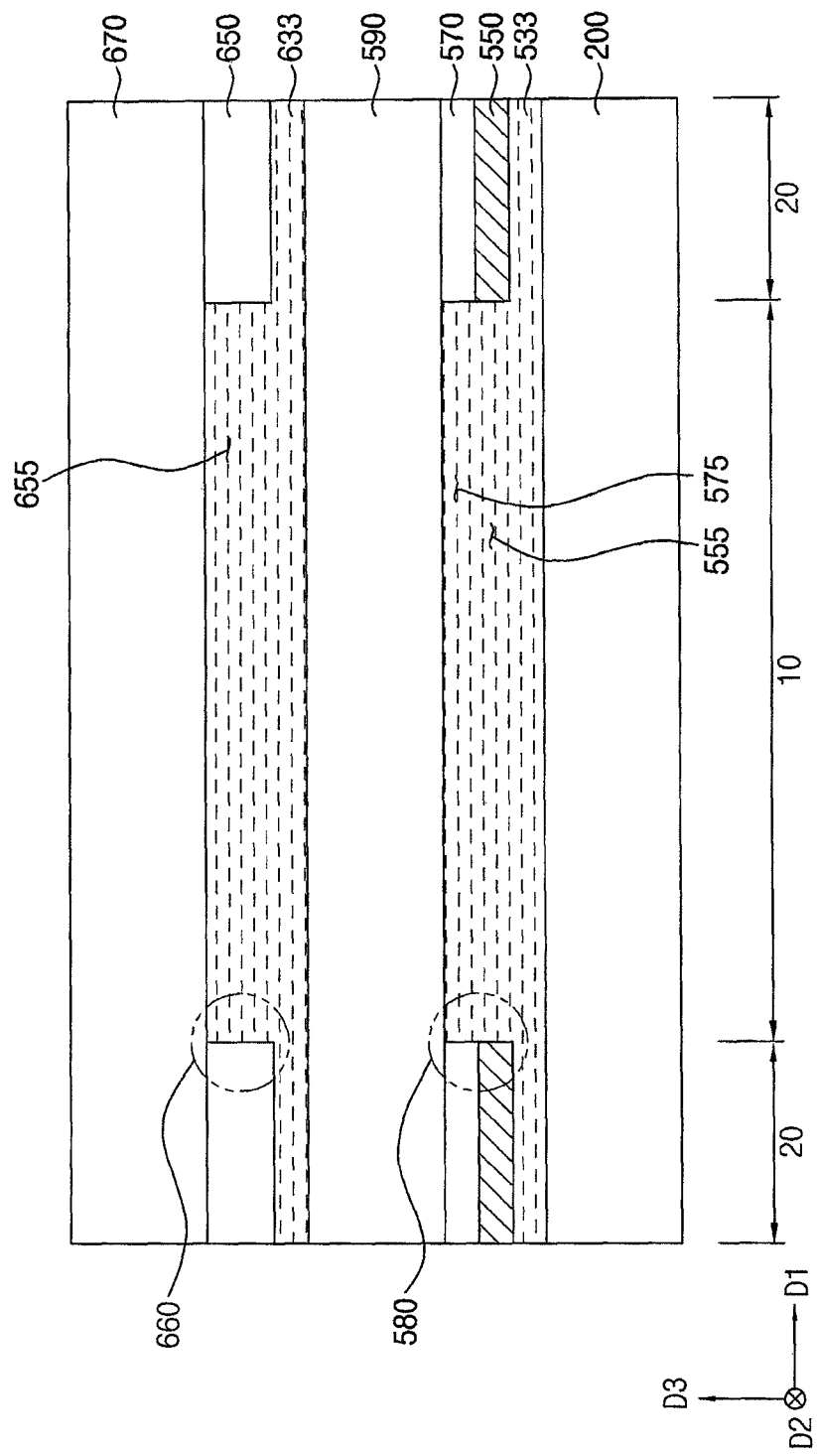
FIG. 17 is a cross-sectional view illustrating a display device in accordance with example embodiments.

Referring to FIG. 17, a display device 1100 may include a display panel 200, a first protection layer 533, a light shielding member 550, a second light transmitting member 570, a first cover member 590, a second protection layer 633, a first light transmitting member 650, and a second cover member 670.

Compared to the display device 800 described above, the display device 1100 may include the first protection layer 533 and the second protection layer 633 instead of the first adhesive member 510 and the second adhesive member 610. In this case, the second protection layer 633 may have a relatively higher adhesive strength than the second protection layer 630 included in the display device 100 so as to adhere the second protection layer 633 and the first cover member 590, and the first protection layer 533 may have a relatively higher adhesive strength than the first protection layer 530 included in the display device 100 so as to adhere the first protection layer 533 and the display panel 200.

Figure 18:
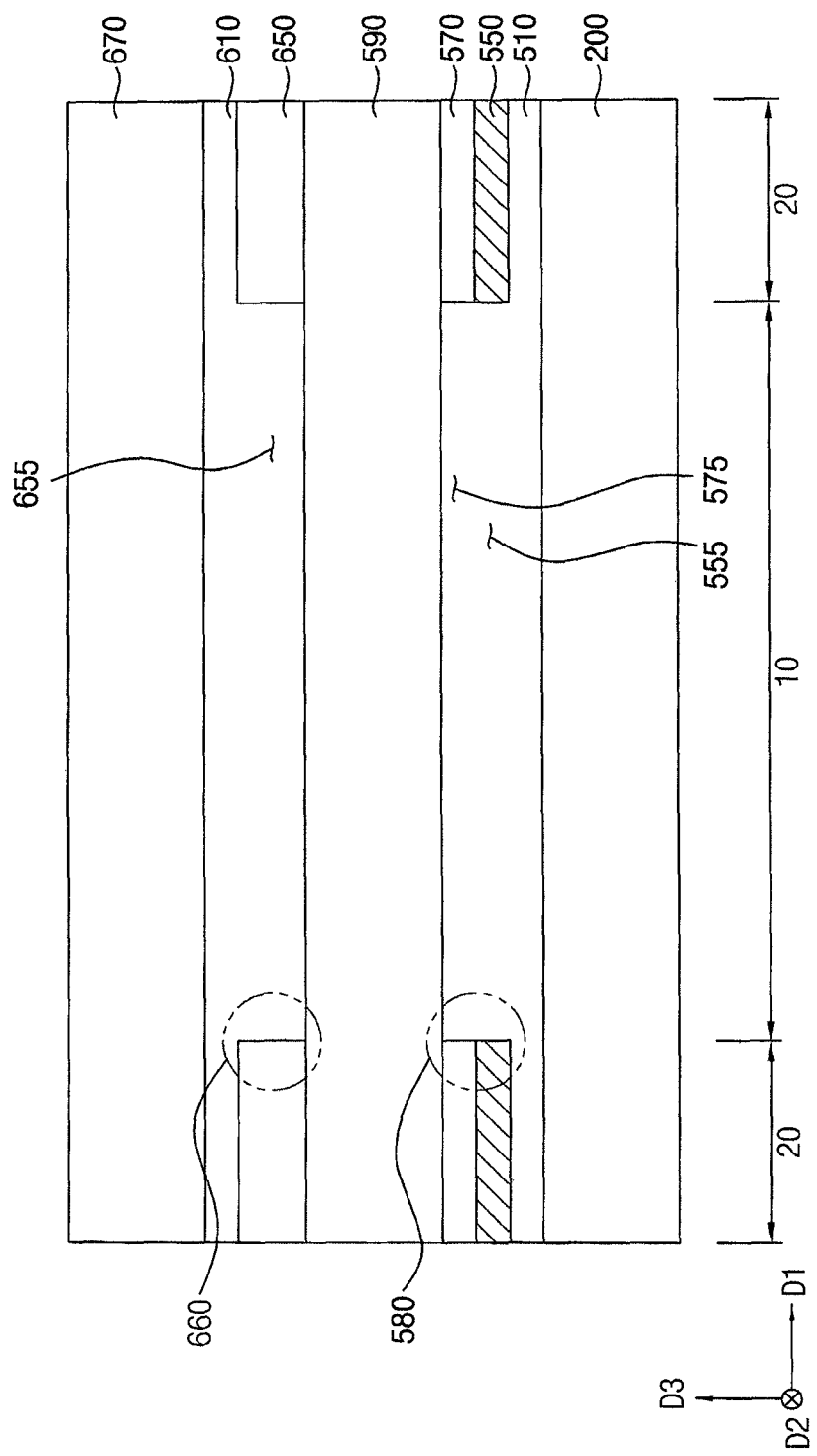
FIG. 18 is a cross-sectional view illustrating a display device in accordance with example embodiments.

Referring to FIG. 18, a display device 1200 may include a display panel 200, a first adhesive member 510, a light shielding member 550, a second light transmitting member 570, a first cover member 590, a first light transmitting member 650, a second adhesive member 610, and a second cover member 670.

Compared to the display device 800 described above, the display device 1200 may include the first light transmitting member 650 that is disposed in the peripheral region 20 on the first cover member 590. For example, the first light transmitting member 650 may be in direct contact with an upper surface of the first cover member 590.

The present invention may be applied to any of various display devices. For example, the present invention may be applied to any of a vehicle-display device, a ship-display device, an aircraft-display device, a portable communication device, a display device for display or for information transfer, a medical-display device, etc.

The foregoing is illustrative of some example embodiments and is not to be construed as limiting thereof. Although a few example embodiments have been described, those skilled in the art will readily appreciate that many modifications are possible in the example embodiments without materially departing from the novel teachings and aspects of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display device comprising:
a display panel including a display region where a plurality of display structures are arranged and a peripheral region surrounding the display region;
a light shielding member in the peripheral region on the display panel, the light shielding member including a first opening that exposes the display region;
a first cover member on the light shielding member;
a first light transmitting member in the peripheral region on the first cover member, the first light transmitting member including a second opening that overlaps with the first opening, the first light transmitting member transmitting a portion of an external light and absorbing a remaining portion of the external light such that the first light transmitting member has a first color in the peripheral region; and
a second cover member on the first light transmitting member.

2. The display device of claim 1, further comprising a first adhesive member between the display panel and the light shielding member.

3. The display device of claim 2, further comprising a second adhesive member between the first cover member and the first light transmitting member.

4. The display device of claim 3, further comprising:
a second light transmitting member between the first cover member and the light shielding member, the second light transmitting member including a third opening,
wherein the third opening overlaps with the first and second openings.

5. The display device of claim 4, wherein the first light transmitting member is in direct contact with a lower surface of the second cover member, and the second light transmitting member is in direct contact with a lower surface of the first cover member and an upper surface of the light shielding member.

6. The display device of claim 4, wherein the second light transmitting member has the first color.

7. The display device of claim 6, wherein a thickness of the second light transmitting member is less than a thickness of the first light transmitting member.

8. The display device of claim 4, further comprising a first protection layer between the first adhesive member and the light shielding member,
wherein the first protection layer fills the first and third openings, and is in direct contact with a lower surface of the first cover member and an upper surface of the first adhesive member, and
wherein the first protection layer covers a lower surface of the light shielding member.

9. The display device of claim 8, wherein a viscosity of the first protection layer is less than a viscosity of the first adhesive member.

10. The display device of claim 8, wherein the first protection layer is in direct contact with side walls defining the first and third openings.

11. The display device of claim 8, further comprising a second protection layer between the second adhesive member and the first light transmitting member,
wherein the second protection layer fills the second opening, and is in direct contact with a lower surface of the second cover member and an upper surface of the second adhesive member, and
wherein the second protection layer covers a lower surface of the first light transmitting member.

12. The display device of claim 11, wherein a viscosity of the second protection layer is less than a viscosity of the second adhesive member.

13. The display device of claim 11, wherein the second protection layer is in direct contact with side walls defining the second opening.

14. The display device of claim 3, further comprising:
a polarizing layer and a touch screen electrode layer that are between the display panel and the first adhesive member,
wherein the display panel, the polarizing layer, and the touch screen electrode layer are sequentially arranged.

15. The display device of claim 1, wherein each of the display structures included in the display panel includes:
a substrate;
a semiconductor element on the substrate;

a light emitting structure on the semiconductor element; and a thin film encapsulation structure on the light emitting structure, wherein the substrate and the thin film encapsulation structure comprise flexible materials.

16. The display device of claim 1, wherein the first color is a white color.

17. A display device comprising:

a display panel including a display region where a plurality of display structures are arranged and a peripheral region surrounding the display region;

a light shielding member in the peripheral region on the display panel, the light shielding member including a first opening that exposes the display region;

a first cover member on the light shielding member;

a first light transmitting member in the peripheral region on the first cover member, the first light transmitting member including a second opening that overlaps with the first opening, the first light transmitting member transmitting a portion of an external light and blocking a remaining portion of the external light such that the first light transmitting member has a first color in the peripheral region; and a second cover member on the first light transmitting member.

18. The display device of claim 17, wherein the first color is a white color.

19. The display device of claim 2, wherein the first adhesive member fills the first opening, and is in direct contact with a lower surface of the first cover member, and wherein the first adhesive member covers a lower surface of the light shielding member.

20. The display device of claim 3, wherein the second adhesive member fills the second opening, and is in direct contact with a lower surface of the second cover member, and wherein the second adhesive member covers a lower surface of the first light transmitting member.

* * * * *